United States Patent
Park et al.

(10) Patent No.: US 12,171,145 B2
(45) Date of Patent: Dec. 17, 2024

(54) POWER GENERATION APPARATUS

(71) Applicant: LG INNOTEK CO., LTD., Seoul (KR)

(72) Inventors: Jeung Ook Park, Seoul (KR); Sang Hun An, Seoul (KR); Ji Hwan Jeon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 196 days.

(21) Appl. No.: 17/758,774

(22) PCT Filed: Jan. 11, 2021

(86) PCT No.: PCT/KR2021/000336
§ 371 (c)(1),
(2) Date: Jul. 13, 2022

(87) PCT Pub. No.: WO2021/145621
PCT Pub. Date: Jul. 22, 2021

(65) Prior Publication Data
US 2023/0039582 A1 Feb. 9, 2023

(30) Foreign Application Priority Data
Jan. 13, 2020 (KR) .................. 10-2020-0004474

(51) Int. Cl.
H10N 10/17 (2023.01)
H10N 10/01 (2023.01)
H10N 10/80 (2023.01)

(52) U.S. Cl.
CPC ............. *H10N 10/17* (2023.02); *H10N 10/01* (2023.02); *H10N 10/80* (2023.02)

(58) Field of Classification Search
None
See application file for complete search history.

(56) References Cited

U.S. PATENT DOCUMENTS

2016/0035957 A1* 2/2016 Casey .................. H10N 10/13
136/230
2018/0083179 A1 3/2018 Yoshida et al.

FOREIGN PATENT DOCUMENTS

| EP | 2 383 809 A1 | 11/2011 |
| JP | 2011-101460 A | 5/2011 |
| JP | 2014-212632 A | 11/2014 |

(Continued)

OTHER PUBLICATIONS

International Search Report dated Apr. 12, 2021 in International Application No. PCT/KR2021/000336.

(Continued)

*Primary Examiner* — Daniel P Malley, Jr.
(74) *Attorney, Agent, or Firm* — Saliwanchik, Lloyd & Eisenschenk

(57) ABSTRACT

A power generation apparatus according to one embodiment of the present invention, comprises: a cooling unit, a first thermoelectric module including a first thermoelectric element disposed on a first surface of the cooling unit, and a first heat sink disposed on the first thermoelectric element; and a first wiring part connected to the first thermoelectric element, wherein the cooling unit has a fluid receiving part formed in a first area thereof and a tunnel formed in a second area thereof, and the first wiring part passes through the tunnel.

17 Claims, 22 Drawing Sheets

(56) References Cited

FOREIGN PATENT DOCUMENTS

| JP | 2016-520993 A | 7/2016 |
|----|---------------|--------|
| JP | 2018-49886 A | 3/2018 |
| KR | 10-2015-0132209 A | 11/2015 |
| KR | 10-2019-0038101 A | 4/2019 |
| WO | 2010/084718 A1 | 7/2010 |
| WO | 2019/194595 A1 | 10/2019 |

OTHER PUBLICATIONS

Supplementary European Search Report dated Nov. 29, 2023 in European Application No. 21741441.6.
Office Action dated Jan. 11, 2024 in Korean Application No. 10-2020-0004474.
Office Action dated Sep. 3, 2024 in Japanese Application No. 2022-542427.

* cited by examiner

2000: 2100, 2200, 2300, 2400, 2500

1900: 1900-1, 1900-2

1100: 1110, 1120, 1130, 1140, 1150, 1160

1100 : 1130, 1140, 1150, 1160

FIG. 12
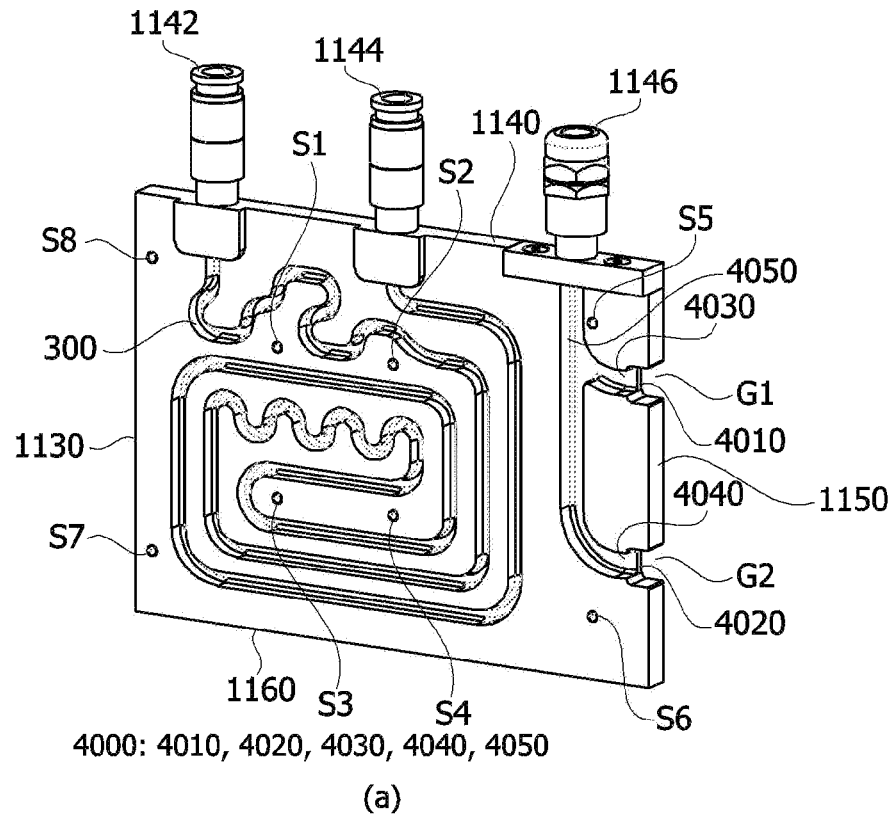
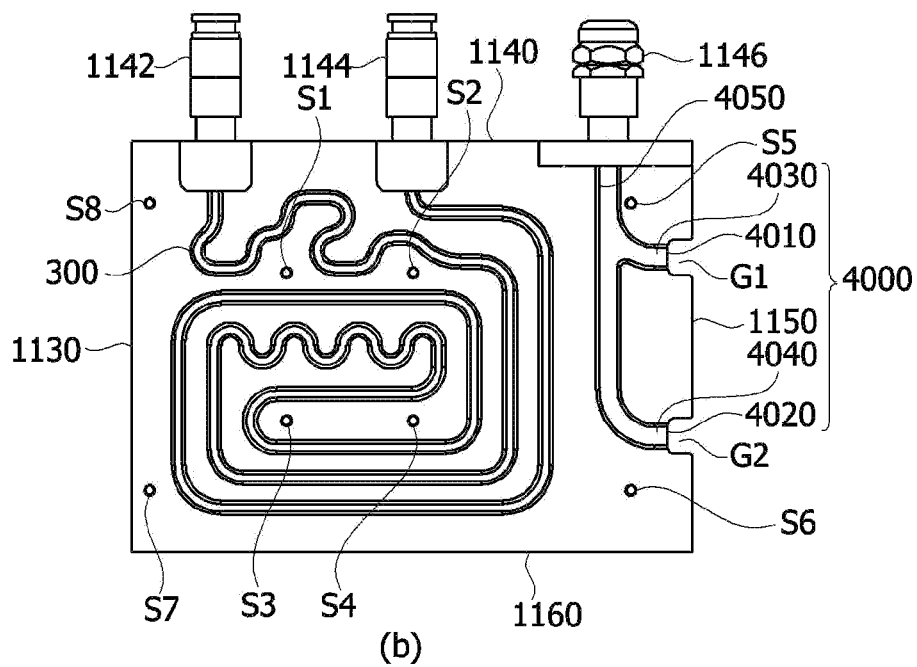

FIG. 15
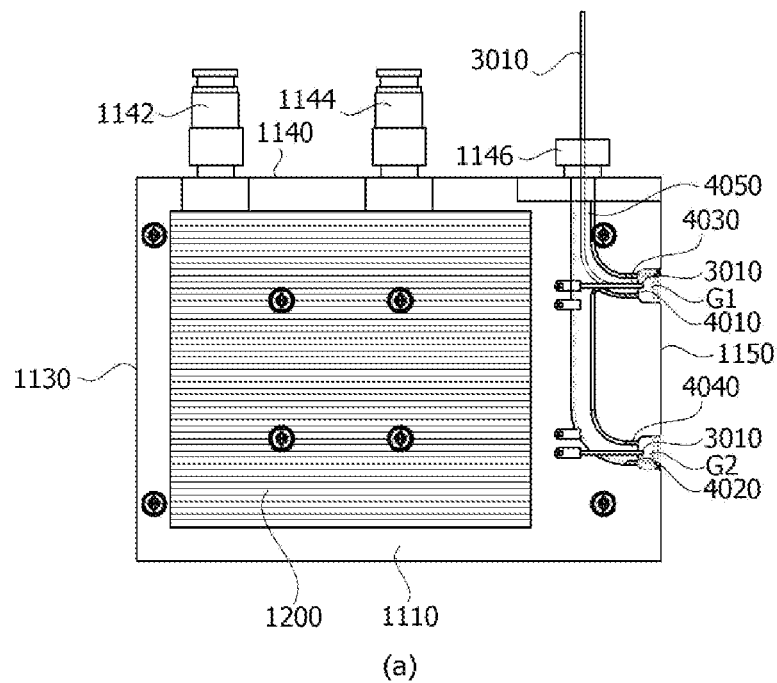
(a)
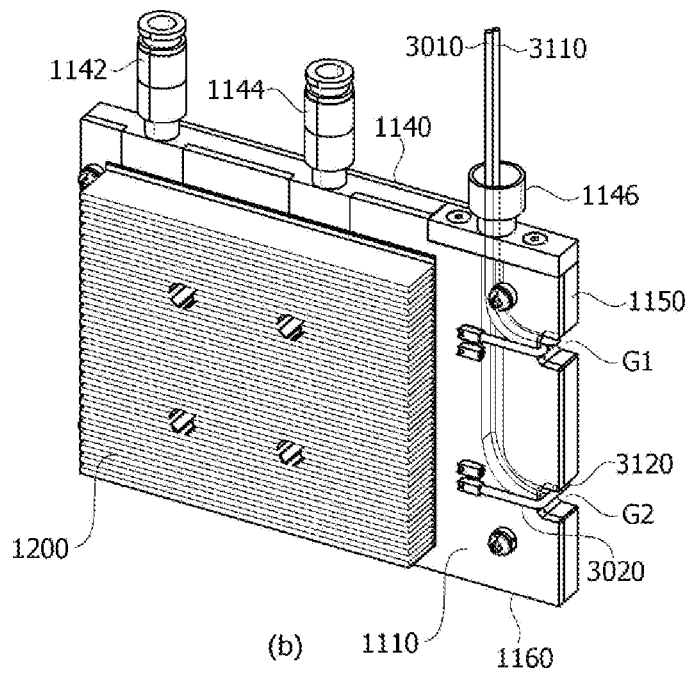
(b)

FIG. 17
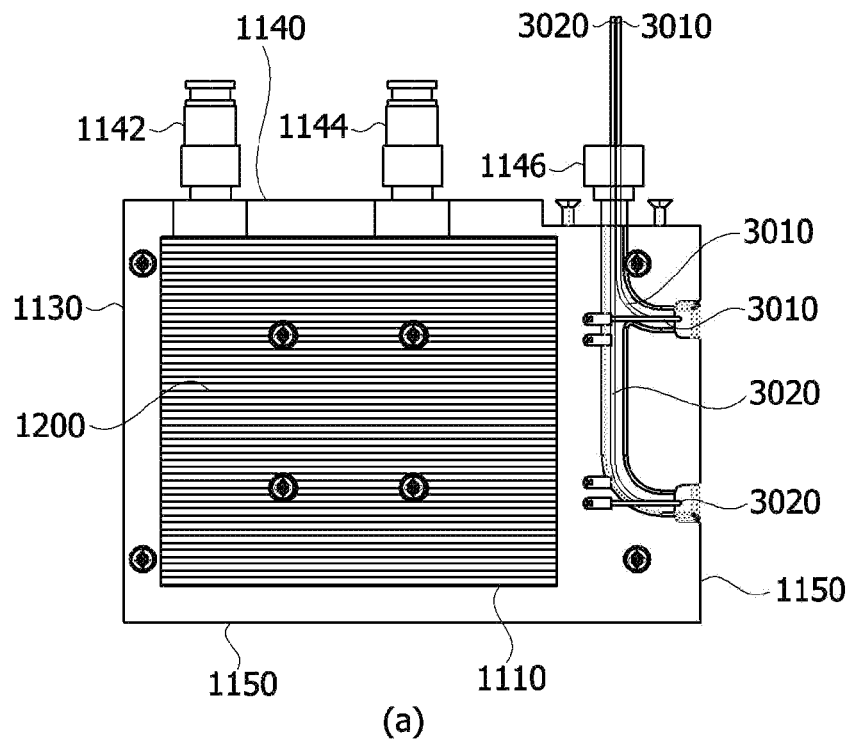
(a)
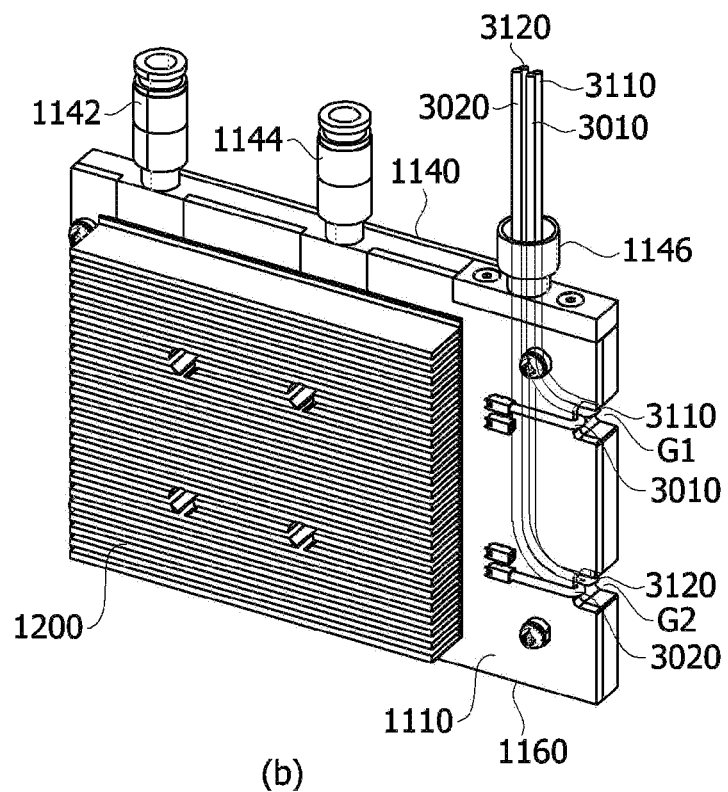
(b)

POWER GENERATION APPARATUS

CROSS-REFERENCE TO RELATED APPLICATIONS

This application is the U.S. national stage application of International Patent Application No. PCT/KR2021/000336, filed Jan. 11, 2021, which claims the benefit under 35 U.S.C. § 119 of Korean Application No. 10-2020-0004474, filed Jan. 13, 2020, the disclosures of each of which are incorporated herein by reference in their entirety.

TECHNICAL FIELD

The present invention relates to a power generation apparatus, and more specifically, to a power generation apparatus for generating power using a temperature difference between a low temperature part and a high temperature part of a thermoelectric element.

BACKGROUND ART

A thermoelectric phenomenon is a phenomenon that occurs by the movement of electrons and holes inside a material and refers to direct energy conversion between heat and electricity.

Thermoelectric elements are a generic term for elements using the thermoelectric phenomenon, and have a structure in which a P-type thermoelectric material and an N-type thermoelectric material are bonded between metal electrodes to form a PN junction pair.

The thermoelectric elements may be classified into an element using a temperature change in electrical resistance, an element using the Seebeck effect, which is a phenomenon in which an electromotive force is generated by a temperature difference, and an element using the Peltier effect, which is a phenomenon in which heat is absorbed or heat is generated by a current.

The thermoelectric elements are variously applied to home appliances, electronic parts, communication parts, and the like. For example, the thermoelectric elements may be applied to a cooling apparatus, a heating apparatus, a power generation apparatus, and the like. Accordingly, the demand for the thermoelectric performance of the thermoelectric element is gradually increasing.

Recently, there has been a need to generate electricity using hot waste heat generated from engines such as vehicles and ships and thermoelectric elements. At this time, a duct through which a first fluid passes is disposed at a low temperature part of the thermoelectric element, a heat dissipation fin is disposed at a high temperature part of the thermoelectric element, and a second fluid having a temperature higher than that of the first fluid may pass through the heat dissipation fin. Accordingly, electricity may be generated by the temperature difference between the low temperature part and the high temperature part of the thermoelectric element, and power generation performance may vary depending on the structure of the power generation apparatus.

Technical Problem

The present invention is directed to providing a power generation apparatus for generating electricity using a temperature difference between a low temperature part and a high temperature part of a thermoelectric element.

Technical Solution

A power generation apparatus according to one embodiment of the present invention includes a cooling unit, a first thermoelectric module including a first thermoelectric element disposed on a first surface of the cooling unit and a first heat sink disposed on the first thermoelectric element, and a first wiring part connected to the first thermoelectric element, wherein a fluid receiving part is formed in a first area of the cooling unit, a tunnel is formed in a second area of the cooling unit, and the first wiring part passes through the tunnel.

The power generation apparatus may further include a wiring drawn-out part disposed on another surface perpendicular to the first surface of the cooling unit, wherein the tunnel may be connected to the wiring drawn-out part, and the first wiring part may be drawn out to the outside through the wiring drawn-out part.

The first thermoelectric module may be disposed in the first area on the first surface, and the first wiring part may be disposed in the second area on the first surface and may extend to the wiring drawn-out part through the tunnel.

The power generation apparatus may further include a fluid inlet and a fluid outlet disposed to be spaced apart from the wiring drawn-out part on another surface of the cooling unit, wherein the fluid inlet and the fluid outlet may be disposed in the first area, and the wiring drawn-out part may be disposed in the second area.

A distance between the fluid inlet and the fluid outlet may be equal to a distance between the fluid inlet or the fluid outlet and the wiring drawn-out part.

The power generation apparatus may include a second thermoelectric module including a second thermoelectric element disposed on a second surface of the cooling unit facing the first surface and a second heat sink disposed on the second thermoelectric element, and a second wiring part connected to the second thermoelectric element, and the second wiring part may be drawn out to the outside through the wiring drawn-out part.

The second thermoelectric module may be disposed in the first area on the second surface, and the second wiring part may be disposed in the second area on the second surface and may extend to the wiring drawn-out part through the tunnel.

The first wiring part may include a 1-1 wiring and a 1-2 wiring, and the second wiring unit may include a 2-1 wiring and a 2-2 wiring, wherein the 1-1 wiring and the 2-1 wiring may be drawn out to the wiring drawn-out part through the tunnel, and the 1-2 wiring and the 2-2 wiring may be connected to each other.

The first wiring part may include the 1-1 wiring and the 1-2 wiring, and the second wiring part may include the 2-1 wiring and the 2-2 wiring, wherein the 1-1 wiring and the 1-2 wiring may have different polarities, the 2-1 wiring and the 2-2 wiring may have different polarities, and the 1-1 wiring, the 1-2 wiring, the 2-1 wiring, and the 2-2 wiring may be drawn out to the wiring drawn-out part through the tunnel.

The tunnel may include a first tunnel through which the 1-1 wiring and the 2-1 wiring pass, and a second tunnel through which the 1-2 wiring and the 2-2 wiring pass.

A fluid passing through the cooling unit may be a first fluid, and a second fluid having a temperature higher than that of the first fluid may pass through the first heat sink.

The cooling unit may include a first surface, a second surface, a third surface between the first surface and the second surface, a fourth surface perpendicular to the third surface and having the wiring drawn-out part disposed thereon, a fifth surface facing the third surface, and a sixth surface facing the fourth surface, and the second fluid may pass in a direction from the third surface toward the fifth surface.

The tunnel may be formed in a direction from the fifth surface toward the fourth surface in the second area between the first surface and the second surface of the cooling unit.

A power generation system according to one embodiment of the present invention includes a first power generation apparatus and a second power generation apparatus disposed on a side surface of the first power generation apparatus, wherein each of the first power generation apparatus and the second power generation apparatus includes a cooling unit, a first thermoelectric module including a first thermoelectric element disposed on a first surface of the cooling unit and a first heat sink disposed on the first thermoelectric element, and a first wiring part connected to the first thermoelectric element, wherein a fluid receiving part is formed in a first area of the cooling unit, a tunnel is formed in a second area of the cooling unit, and the first wiring part passes through the tunnel.

The power generation apparatus may further include a wiring drawn-out part disposed on another surface perpendicular to the first surface of the cooling unit, wherein the tunnel may be connected to the wiring drawn-out part, and the first wiring part may be drawn out to the outside through the wiring drawn-out part.

The first thermoelectric module may be disposed in the first area on the first surface, and the first wiring part may be disposed in the second area on the first surface and may extend to the wiring drawn-out part through the tunnel.

The power generation apparatus may further include a fluid inlet and a fluid outlet disposed to be spaced apart from the wiring drawn-out part on another surface of the cooling unit, wherein the fluid inlet and the fluid outlet are disposed in the first area, the wiring drawn-out part is disposed in the second area, a distance between the fluid inlet and the fluid outlet of the first power generation apparatus is equal to a distance between the fluid inlet or the fluid outlet of the first power generation apparatus and the wiring drawn-out part, and a distance between the fluid inlet or the fluid outlet of the first power generation apparatus and the wiring drawn-out part is equal to a distance between the wiring drawn-out part of the first power generation apparatus and the fluid inlet or the fluid outlet of the second power generation apparatus.

Advantageous Effects

According to an embodiment of the present invention, it is possible to obtain a power generation apparatus with excellent power generation performance. In addition, according to the embodiment of the present invention, it is possible to obtain the power generation apparatus with improved heat transfer efficiency to a thermoelectric element.

In addition, according to the embodiment of the present invention, it is possible to efficiently connect a wiring of the power generation apparatus and minimize the influence of the wiring on the flow of a fluid.

DESCRIPTION OF DRAWINGS

FIG. 12 shows an example of a cross-sectional view of a cooling unit included in the power generation apparatus according to one embodiment of the present invention.

FIG. 15 is a plan view and a perspective view of the power generation apparatus according to the embodiment of FIG. 14.

FIG. 17 is a plan view and a perspective view of the power generation apparatus according to the embodiment of FIG. 16.

MODES OF THE INVENTION

Hereinafter, exemplary embodiments of the present invention will be described in detail with reference to the accompanying drawings.

However, the technical spirit of the present invention is not limited to some embodiments described but may be implemented in various different forms, and one or more of the components may be used by being selectively coupled or substituted between the embodiments without departing from the technical spirit scope of the present invention.

In addition, terms (including technical and scientific terms) used in the embodiments of the present invention may be construed as the meaning that may be generally understood by those skilled in the art to which the present invention pertains, unless specifically defined and described explicitly, and the meaning of generally used terms such as terms defined in the dictionary may be construed in consideration of the contextual meaning of the related art.

In addition, the terms used in the embodiments of the present invention are intended to describe the embodiments and are not intended to limit the present invention.

In this specification, the singular form may also include the plural form unless otherwise specified in the phrase, and when it is described as "at least one (or one or more) of A and B, C", it may include one or more of all possible combinations of A, B, and C.

In addition, in describing the components of the embodiment of the present invention, terms such as first, second, A, B, (a), and (b) may be used.

These terms are only intended to distinguish the component from other components, and the essence, sequence, or order of the corresponding components are not limited by the terms.

In addition, when it is described that a component is 'connected', 'coupled', or 'connected' to another component, this may include a case in which the component is not only directly connected, coupled, or connected to another component, but also a case in which the component is 'connected', 'coupled', or 'connected' to another component through other components interposed therebetween.

In addition, when it is described as being formed or disposed on "top (above) or bottom (below)" of each component, the top (above) or bottom (below) includes not only a case in which two components come into direct contact with each other but also a case in which one or more other components are formed or disposed between the two components. In addition, when expressed as "top (above) or bottom (below)", this may also include the meaning of not only an upward direction but also a downward direction with respect to one component.

Figure 1:
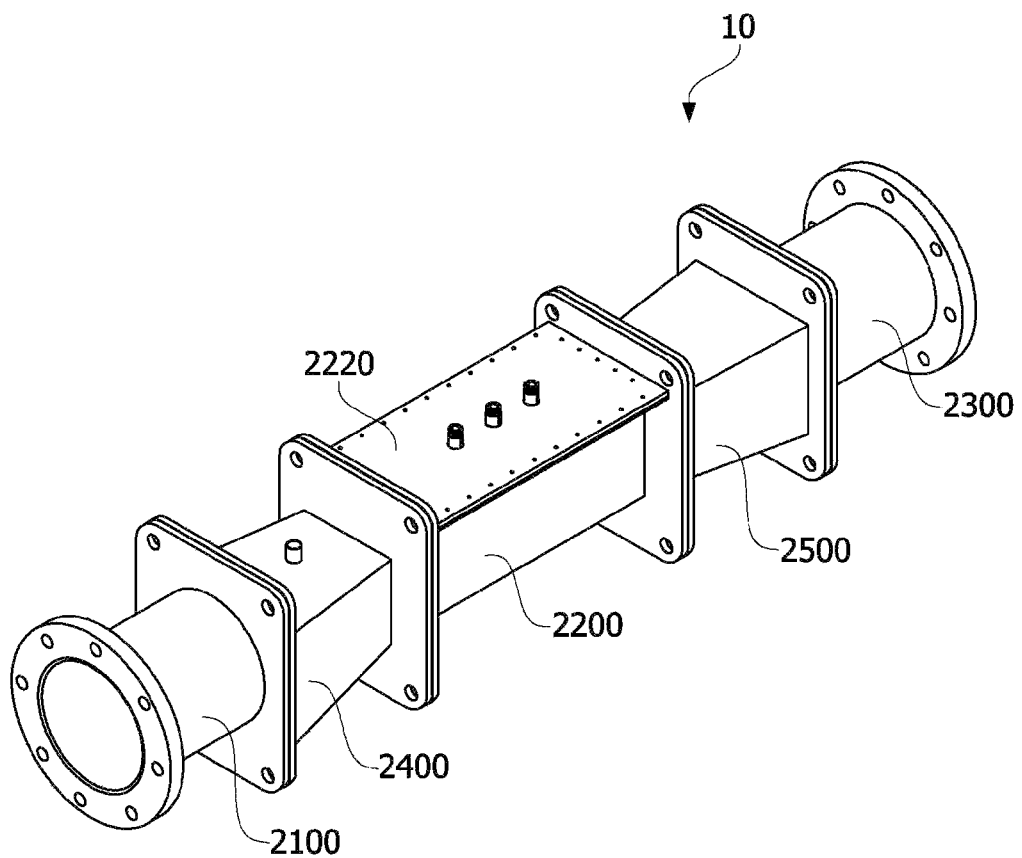
FIG. 1 is a perspective view of a power generation system according to one embodiment of the present invention.
Figure 2:
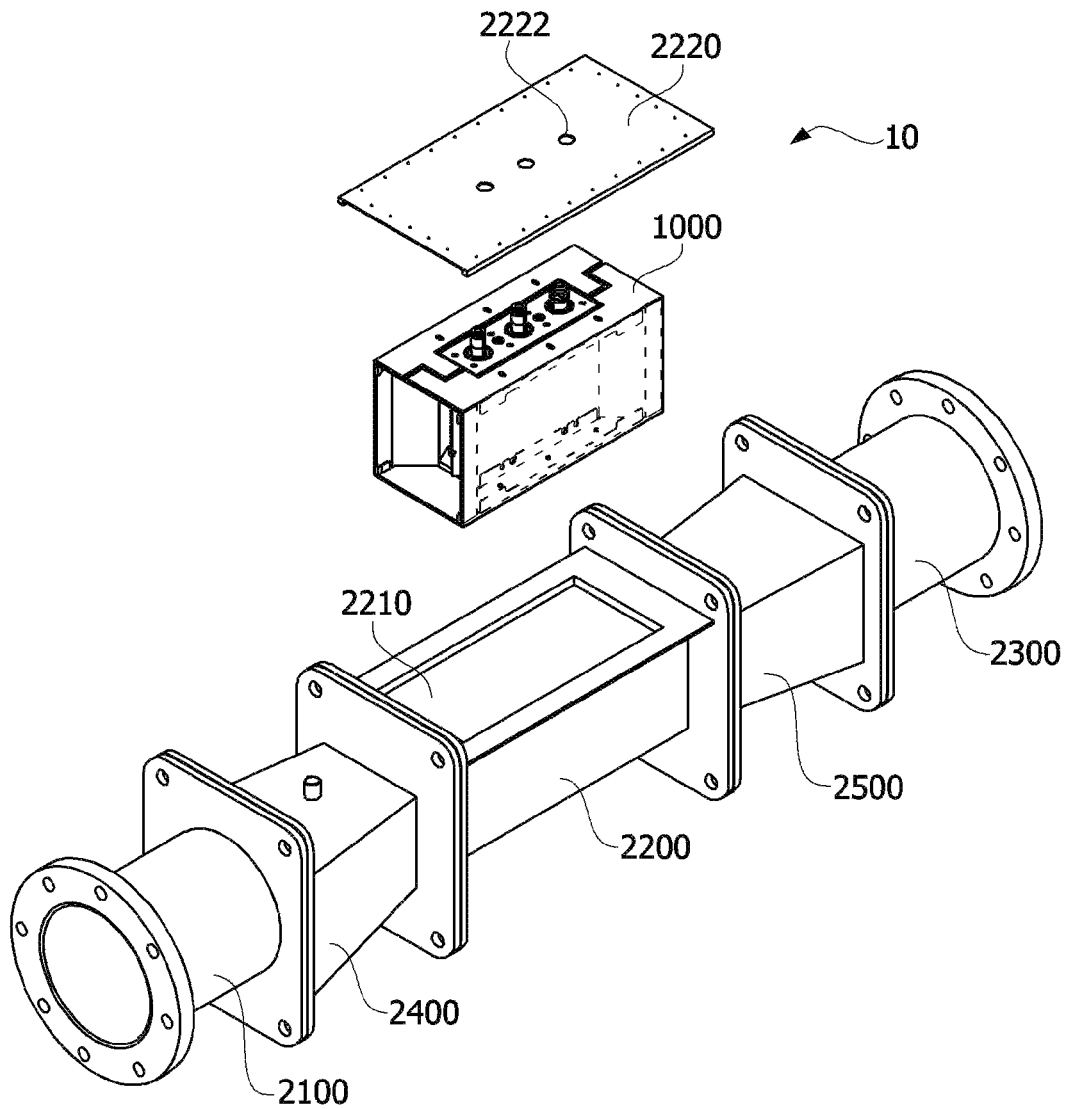
FIG. 2 is an exploded perspective view of the power generation system according to one embodiment of the present invention.
Figure 3:
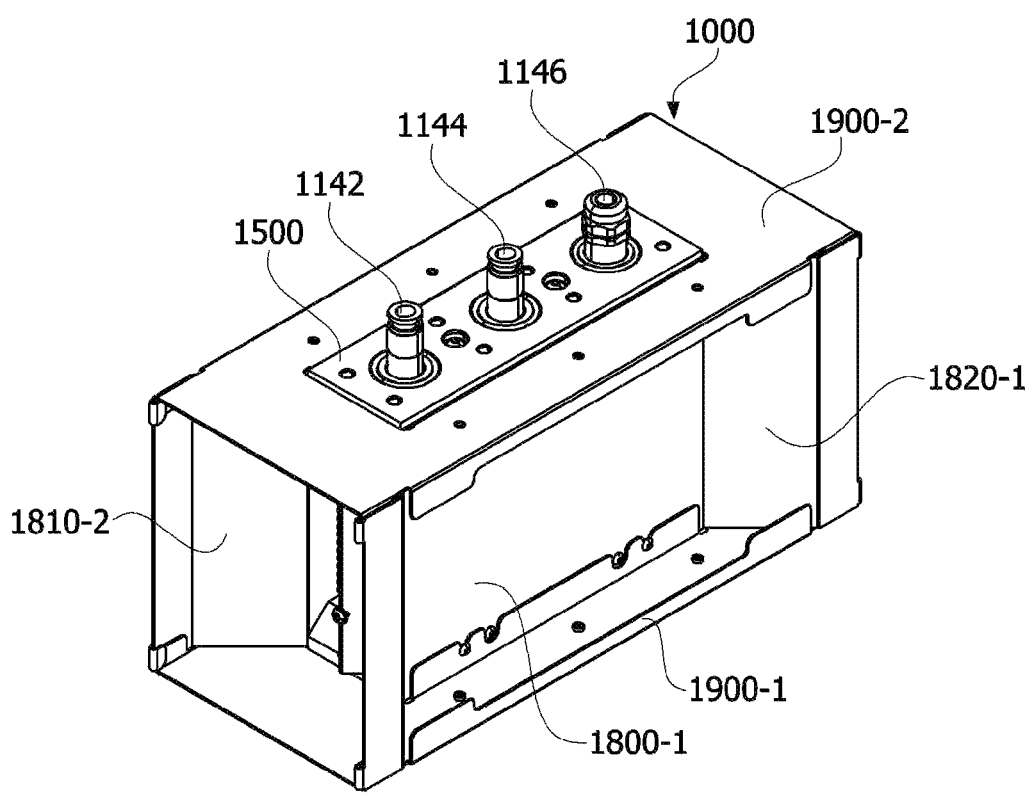
FIG. 3 is a perspective view of a power generation apparatus included in the power generation system according to one embodiment of the present invention.
Figure 4:
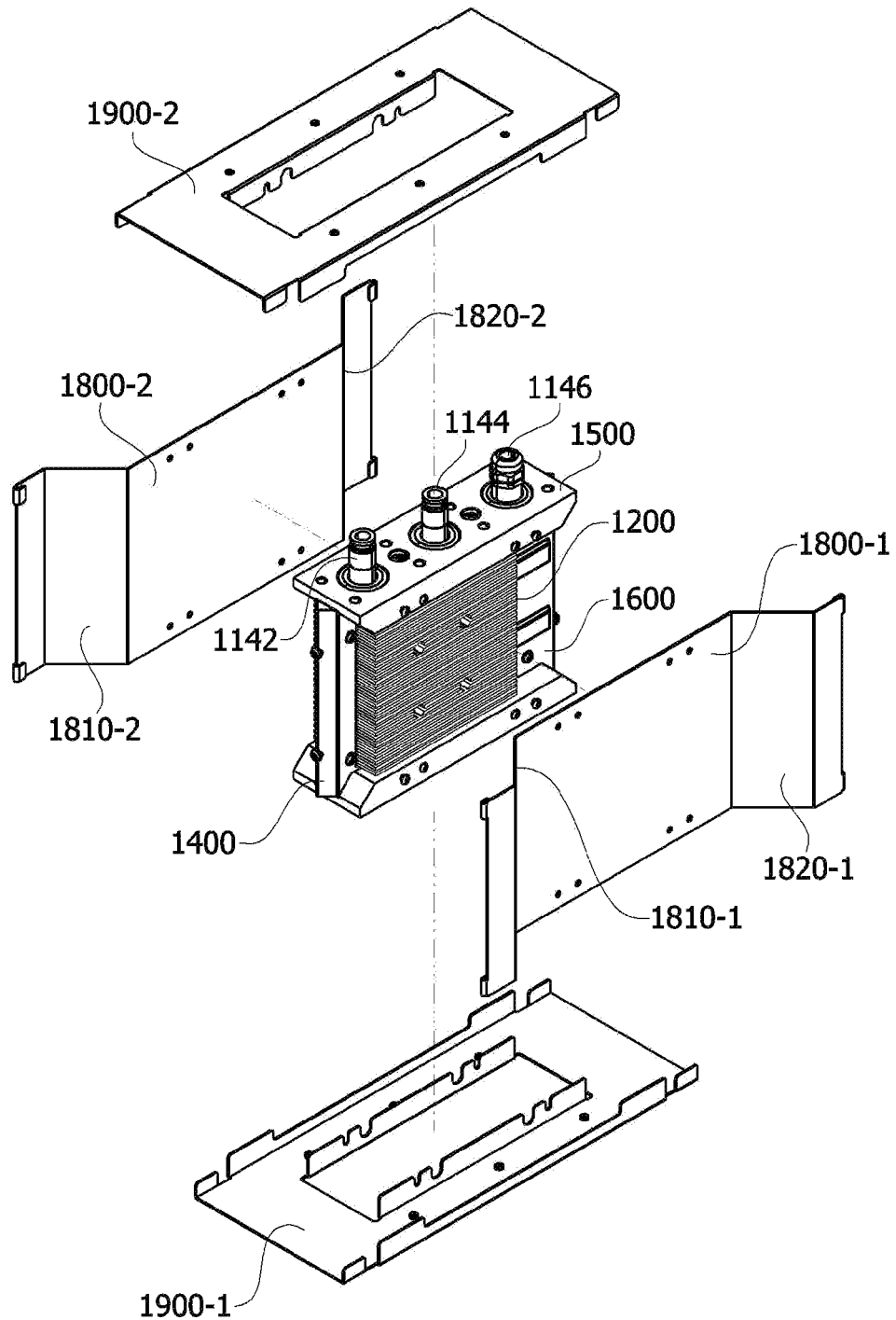
FIG. 4 is an exploded view of the power generation apparatus according to one embodiment of the present invention.
Figure 5:
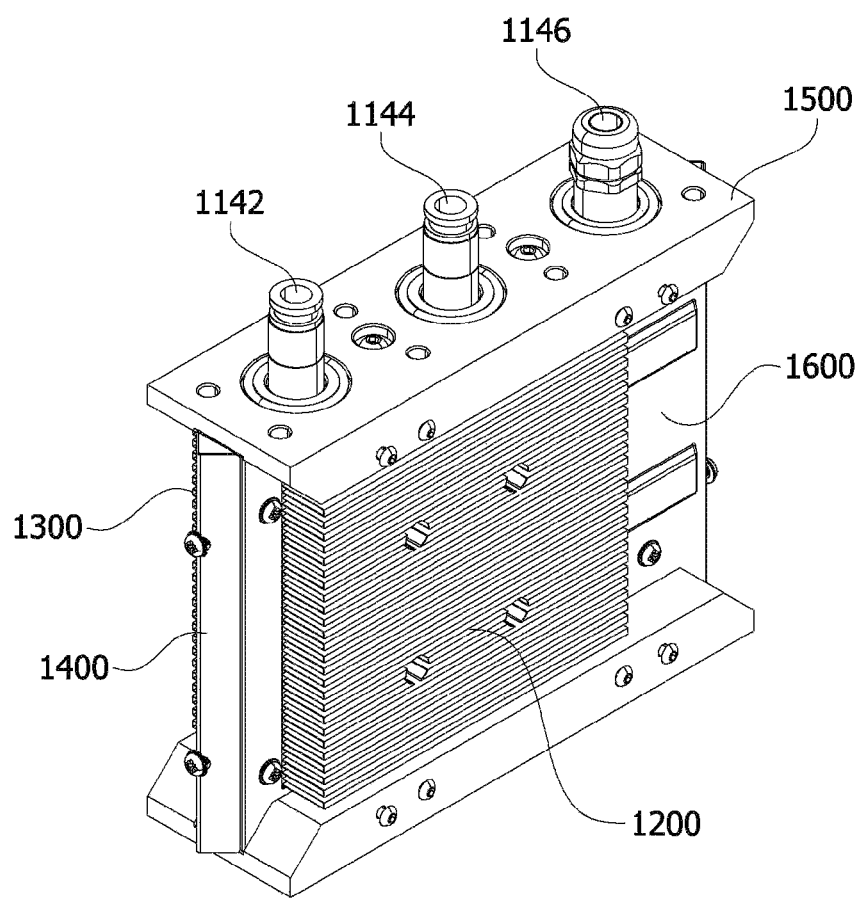
FIG. 5 is a perspective view of a power generation module included in the power generation apparatus according to one embodiment of the present invention.
Figure 6:
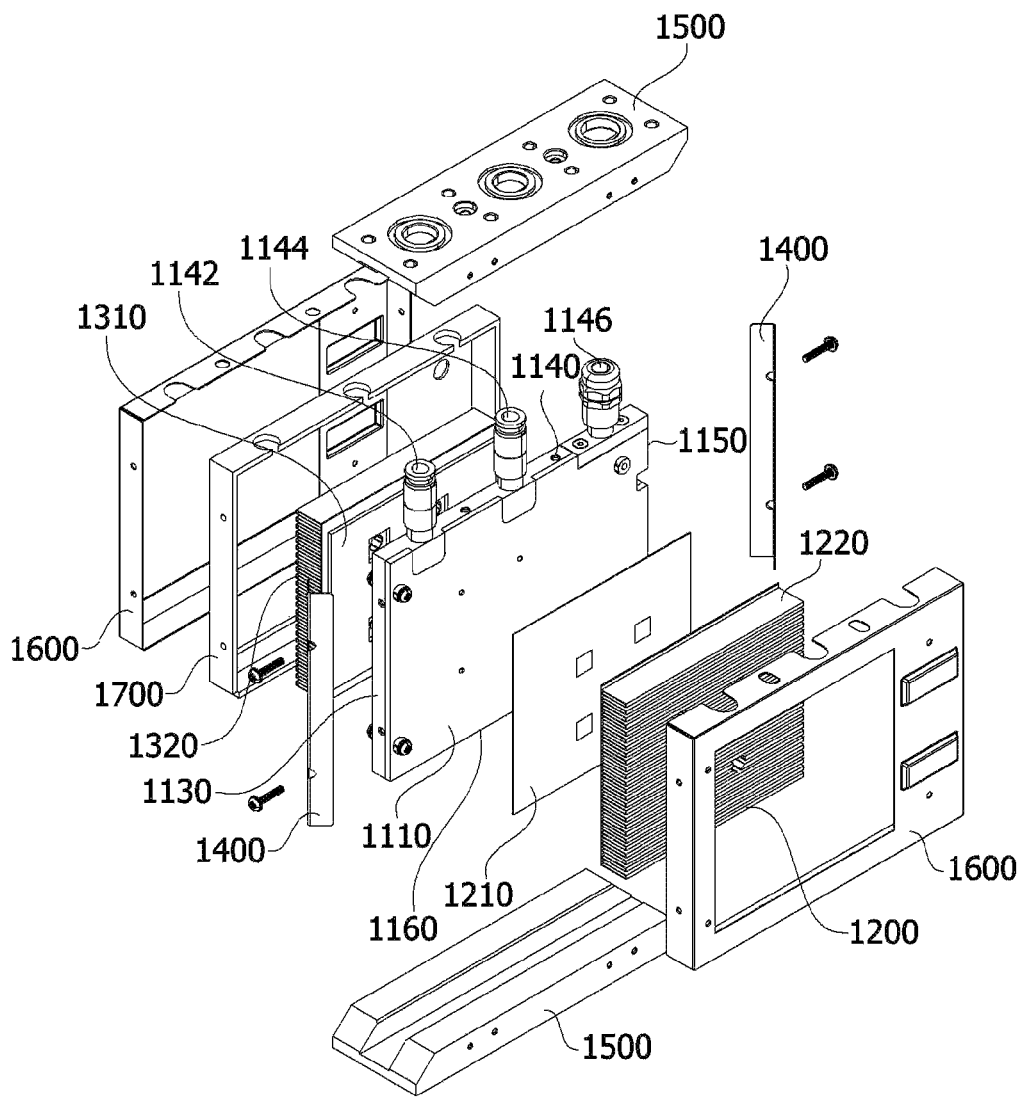
FIG. 6 is an exploded perspective view of the power generation module according to one embodiment of the present invention.
Figure 7A:
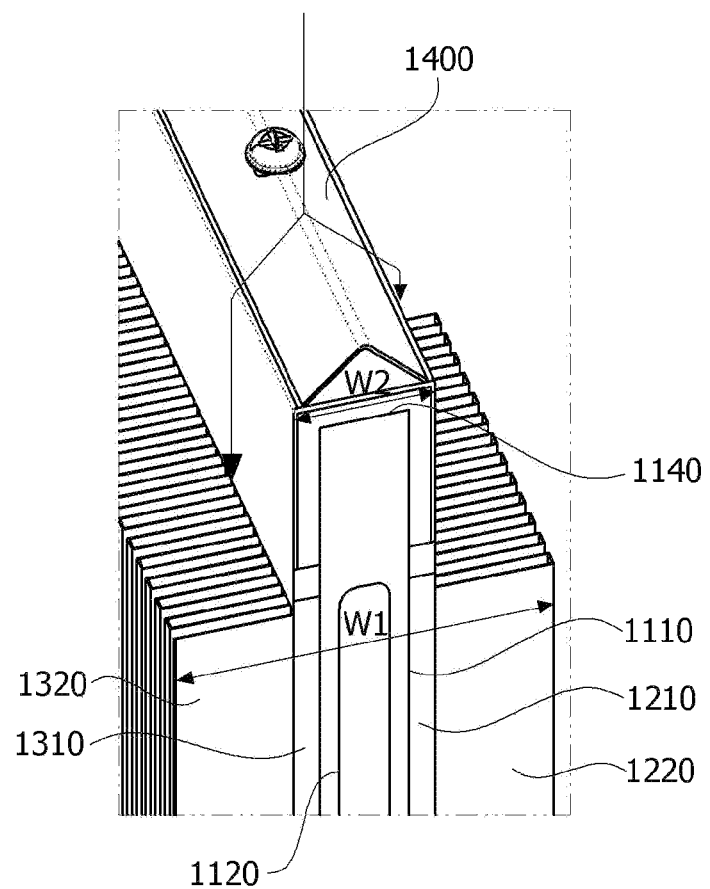
FIGS. 7A and 7B are partially enlarged view-views of the power generation module according to one embodiment of the present invention.
Figure 7B:
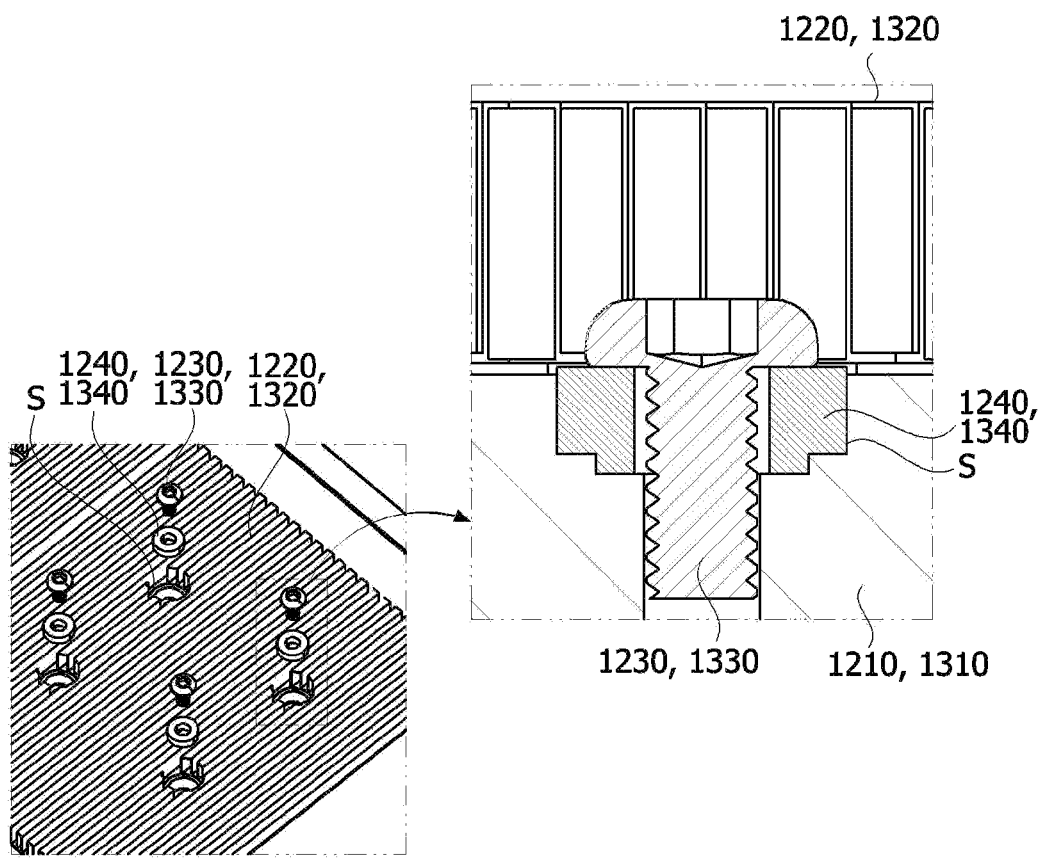
Figure 8:
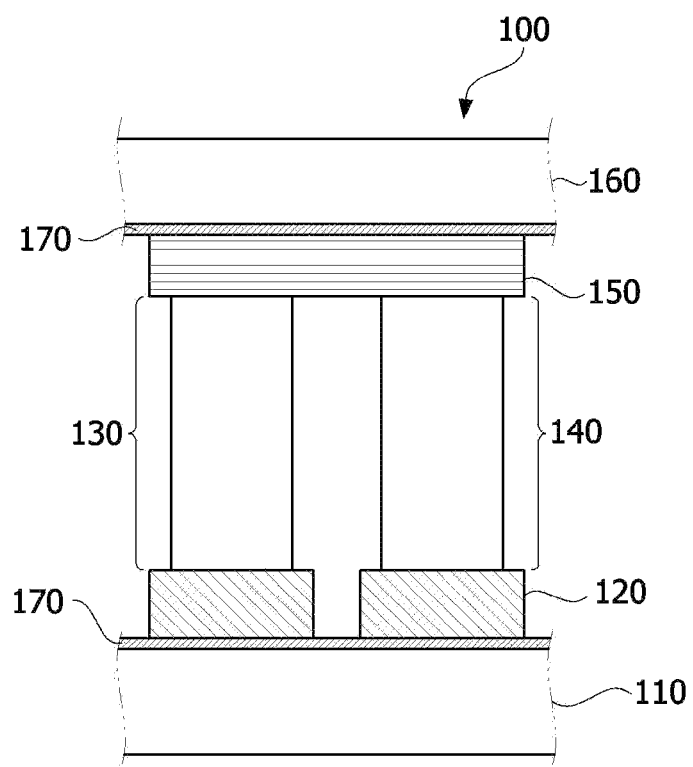
FIGS. 8 and 9 are a cross-sectional view and a perspective view of a thermoelectric element included in the power generation module according to one embodiment of the present invention.
Figure 9:
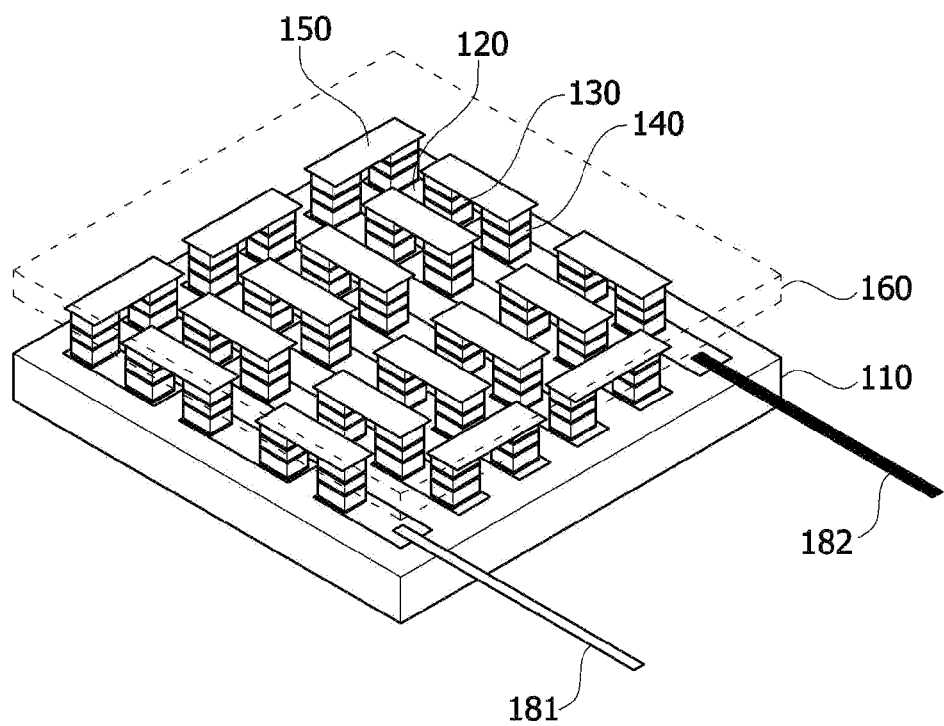

FIG. 1 is a perspective view of a power generation system according to one embodiment of the present invention, FIG. 2 is an exploded perspective view of the power generation system according to one embodiment of the present invention, and FIG. 3 is a perspective view of a power generation apparatus included in the power generation system according to one embodiment of the present invention. FIG. 4 is an exploded view of the power generation apparatus according to one embodiment of the present invention, FIG. 5 is a perspective view of a power generation module included in the power generation apparatus according to one embodiment of the present invention, and FIG. 6 is an exploded perspective view of the power generation module according to one embodiment of the present invention. FIGS. 7A and 7B are partially enlarged view views of the power generation module according to one embodiment of the present invention, and FIGS. 8 and 9 are a cross-sectional view and a perspective view of a thermoelectric element included in the power generation module according to one embodiment of the present invention.

Referring to FIGS. 1 and 2, a power generation system 10 includes a power generation apparatus 1000 and a fluid tube 2000.

A fluid introduced into the fluid tube 2000 may be a heat source generated by an engine of a vehicle or a ship, or a power plant or a steel mill, but is not limited thereto. A temperature of the fluid discharged from the fluid tube 2000 is lower than a temperature of the fluid introduced into the fluid tube 2000. For example, the temperature of the fluid introduced into the fluid tube 2000 may be 100° C. or higher, preferably, 200° C. or higher, and more preferably, 220° C. to 250° C., but is not limited thereto, and may be variously applied depending on a temperature difference between a high temperature part and a low temperature part of a thermoelectric element.

The fluid tube 2000 includes a fluid inlet 2100, a fluid passing part 2200, and a fluid outlet 2300. The fluid introduced through the fluid inlet 2100 passes through the fluid passing part 2200 and is discharged through the fluid outlet 2300. At this time, the power generation apparatus 1000 according to the embodiment of the present invention is disposed in the fluid passing part 2200, and the power generation apparatus 1000 generates electricity using a temperature difference between a first fluid passing through the power generation apparatus 1000 and a second fluid passing through the fluid passing part 2200. Here, the first fluid may be a cooling fluid, and the second fluid may be a hot fluid having a temperature higher than that of the first fluid. The power generation apparatus 1000 according to the embodiment of the present invention may generate electricity using the temperature difference between the first fluid flowing through one surface of the thermoelectric element and the second fluid flowing through the other surface of the thermoelectric element.

When cross-sectional shapes of the fluid inlet 2100 and the fluid outlet 2300 are different from a cross-sectional shape of the fluid passing part 2200, the fluid tube 2000 may further include a first connection part 2400 configured to connect the fluid inlet 2100 and the fluid passing part 220 and a second connection part 2500 configured to connect the fluid passing part 2200 and the fluid outlet 2300. For example, the general fluid inlet 2100 and fluid outlet 2300 may have a cylindrical shape. In contrast, the fluid passing part 2200 in which the power generation apparatus 1000 is disposed may have a quadrangular tubular or polygonal tubular shape. Accordingly, the fluid inlet 2100 and one end of the fluid passing part 2200 may be connected, and the fluid outlet 2300 and the other end of the fluid passing part 2200 may be connected via the first connection part 2400 and the second connection part 2500 whose one end has a cylindrical tubular shape and the other end has a quadrangular tubular shape.

At this time, the fluid inlet 2100 and the first connection part 2400, the first connection part 2400 and the fluid passing part 2200, the fluid passing part 2200 and the second connection part 2500, and the second connection part 2500 and the fluid outlet 2300 may be connected to each other by fastening members.

As described above, the power generation apparatus 1000 according to the embodiment of the present invention may be disposed in the fluid passing part 2200. To easily assemble the power generation system 10, one surface of the fluid passing part 2200 may be designed to have an openable/closable structure. After one surface 2210 of the fluid passing part 2200 is open, the power generation apparatus 1000 may be received in the fluid passing part 2200, and the open one surface 2210 of the fluid passing part 2200 may be covered by a cover 2220. At this time, the cover 2220 may be fastened to the open one surface 2210 of the fluid passing part 2200 by a plurality of fastening members.

The first fluid is supplied to the power generation apparatus 1000 from the outside and then discharged to the outside again, and when a wiring connected to the power generation apparatus 1000 is drawn out to the outside, the cover 2220 may also be formed with a plurality of holes 2222 in order to introduce and discharge the first fluid and draw out the wiring.

Referring to FIGS. 3 to 77B, the power generation apparatus 1000 according to the embodiment of the present invention includes a duct 1100, a first thermoelectric module 1200, a second thermoelectric module 1300, a branch part 1400, a separation member 1500, a shield member 1600, and a heat insulating member 1700. In addition, the power generation apparatus 1000 according to the embodiment of the present invention further includes a guide plate 1800 and a support frame 1900.

As shown in FIG. 5, the duct 1100, the first thermoelectric module 1200, the second thermoelectric module 1300, the branch part 1400, the separation member 1500, the shield member 1600, and the heat insulating member 1700 may be assembled into one module.

The power generation apparatus 1000 according to the embodiment of the present invention may generate power using the temperature difference between the first fluid flowing through an inside of the duct 1100 and the second fluid passing through heat sinks 1220 and 1320 of the first thermoelectric module 1200 and the second thermoelectric module 1300 disposed outside the duct 1100.

In this specification, the temperature of the first fluid flowing through the inside of the duct 1100 may be lower than the temperature of the second fluid passing through the heat sinks 1220 and 1320 of the thermoelectric modules 1200 and 1300 disposed outside the duct 1100. In this specification, the first fluid may be for cooling. To this end, the first thermoelectric module 1200 may be disposed on one surface of the duct 1100, and the second thermoelectric module 1300 may be disposed on another surface of the duct 1100. At this time, a surface disposed to face the duct 1100 of both surfaces of each of the first thermoelectric module 1200 and the second thermoelectric module 1300 becomes the low-temperature part, and power may be generated by using the temperature difference between the low temperature part and the high temperature part. Accordingly, in this specification, the duct 1100 may be referred to as a cooling unit.

The first fluid introduced into the duct 1100 may be water, but is not limited thereto, and may be various types of fluids having cooling performance. The temperature of the first fluid introduced into the duct 1100 may be less than 100° C., preferably, less than 50° C., and more preferably, less than 40° C., but is not limited thereto. The temperature of the first fluid discharged after passing through the duct 1100 may be higher than the temperature of the first fluid introduced into the duct 1100. Each duct 1100 has a first surface 1110, a second surface 1120 facing the first surface 1110 and disposed parallel to the first surface 1110, a third surface 1130 disposed between the first surface 1110 and the second surface 1120, a fourth surface 1140 disposed to be perpendicular to the third surface 1130 between the first surface 1110 and the second surface 1120, a fifth surface 1150 disposed to face the third surface 1130, and a sixth surface 1160 disposed to face the fourth surface 1140, and the first fluid passes through the inside of the duct. When the first thermoelectric module 1200 and the second thermoelectric module 1300 are disposed on the first surface 1110 and the second surface 1120 of the duct 1100, respectively, the third surface 1130 may be a surface disposed in a direction in which the second fluid is introduced, and the fourth surface 1140 may be a surface disposed in a direction in which the first fluid is introduced and discharged. To this end, a first fluid inlet 1142 and a first fluid outlet 1144 may be formed on the fourth surface 1140 of the duct 1100. The first fluid inlet 1142 and the first fluid outlet 1144 may be connected to a fluid receiving part within the duct 1100. Accordingly, the first fluid introduced from the first fluid inlet 1142 may be discharged from the first fluid outlet 1144 after passing through the fluid receiving part.

Although not shown, a heat dissipation fin may be disposed on an inner wall of the duct 1100. The shape and number of the heat dissipation fins, and the area of the heat dissipation fin occupying the inner wall of the duct 1100 may be variously changed depending on the temperature of the first fluid, the temperature of the waste heat, the required power generation capacity, and the like. The area of the heat dissipation fin occupying the inner wall of the duct 1100 may be, for example, 1 to 40% of a cross-sectional area of the duct 1100. Accordingly, it is possible to obtain high thermoelectric conversion efficiency without interfering with the flow of the first fluid. At this time, the heat dissipation fin may have a shape that does not interfere with the flow of the first fluid. For example, the heat dissipation fin may be formed in a direction in which the first fluid flows. In other words, the heat dissipation fin may have a plate shape extending in a direction from the first fluid inlet toward the first fluid outlet, and the plurality of heat dissipation fins may be disposed to be spaced apart from each other by a predetermined interval. The heat dissipation fin may be formed integrally with the inner wall of the duct 1100.

In the embodiment of the present invention, the direction of the second fluid flowing through the fluid passing part 2200 and the introduction/discharge directions of the first fluid flowing through the duct 1100 may be different. For example, the introduction/discharge directions of the first fluid and the passing direction of the second fluid may be different by about 90°. Accordingly, it is possible to obtain uniform heat conversion performance in the entire area.

Meanwhile, the first thermoelectric module 1200 may be disposed on the first surface 1110 of the duct 1100, and the second thermoelectric module 1300 may be disposed to be symmetrical to the first thermoelectric module 1200 on the second surface 1120 of the duct 1100.

The first thermoelectric module 1200 and the second thermoelectric module 1300 may be fastened to the duct 1100 using a screw or a coil spring. Accordingly, the first thermoelectric module 1200 and the second thermoelectric module 1300 may be stably coupled to the surface of the duct 1100. Alternatively, at least one of the first thermoelectric module 1200 and the second thermoelectric module 1300 may also be bonded to the surface of the duct 1100 using a thermal interface material (TIM). By using the coil spring, the thermal interface material (TIM), and/or the screw, it is possible to uniformly control the uniformity of heat applied to the first thermoelectric module 1200 and the second thermoelectric module 1300 even at a high temperature.

Meanwhile, as shown in FIG. 7A, each of the first thermoelectric module 1200 and the second thermoelectric module 1300 includes thermoelectric elements 1210 and 1310 disposed on each of the first surface 1110 and the second surface 1120 and the heat sinks 1220 and 1320 disposed on the thermoelectric elements 1210 and 1310. As described above, the duct 1100 through which the first fluid flows is disposed on one surface of both surfaces of each of the thermoelectric elements 1210 and 1310, and the heat sinks 1220 and 1320 are disposed on the other surface thereof, and when the second fluid passes through the heat sinks 1220 and 1320, it is possible to increase the temperature difference between heat absorption surfaces and heat dissipation surfaces of the thermoelectric elements 1210 and 1310, thereby increasing the thermoelectric conversion efficiency. At this time, when the direction from the first surface 1110 toward the thermoelectric element 1210 and the heat sink 1220 is defined as a first direction, a length in the first direction of the heat sink 1220 may be longer than a length in the first direction of the thermoelectric element 1210. Accordingly, since a contact area between the second fluid and the heat sink 1220 is increased, a temperature of the heat absorption surface of the thermoelectric element 1210 may be increased.

At this time, referring to FIG. 7B, the heat sinks 1220 and 1320 and the thermoelectric elements 1210 and 1310 may be fastened by a plurality of fastening members 1230 and 1330.

Here, the fastening members 1230 and 1330 may be the coil spring or the screw. To this end, at least some of the heat dissipation fins 1220 and 1320 and the thermoelectric elements 1210 and 1310 may have through holes S through which the fastening members 1230 and 1330 pass. Here, separate insulators 1240 and 1340 may be further disposed between the through holes S and the fastening members 1230 and 1330. The separate insulators 1240 and 1340 may be insulators surrounding outer circumferential surfaces of the fastening members 1230 and 1330 or insulators surrounding wall surfaces of the through holes S. For example, the insulators 1240 and 1340 may have a ring shape. Inner circumferential surfaces of the insulators 1240 and 1340 having the ring shape may be disposed on the outer circumferential surfaces of the fastening members 1230 and 1330, and outer circumferential surfaces of the insulators 1240 and 1340 may be disposed on inner circumferential surfaces of the through holes S. Accordingly, the fastening members 1230 and 1330 and the heat sinks 1220 and 1320 and the thermoelectric elements 1210 and 1310 may be insulated.

At this time, the structures of the thermoelectric elements 1210 and 1310 may have the structure of a thermoelectric element 100 shown in FIGS. 8 and 9. Referring to FIGS. 8 and 9, the thermoelectric element 100 includes a lower substrate 110, a lower electrode 120, a P-type thermoelectric leg 130, an N-type thermoelectric leg 140, an upper electrode 150, and an upper substrate 160.

The lower electrode 120 is disposed between the lower substrate 110 and lower bottom surfaces of the P-type thermoelectric leg 130 and the N-type thermoelectric leg 140, and the upper electrode 150 is disposed between the upper substrate 160 and upper bottom surfaces of the P-type thermoelectric leg 130 and the N-type thermoelectric leg 140. Accordingly, a plurality of P-type thermoelectric legs 130 and a plurality of N-type thermoelectric legs 140 are electrically connected by the lower electrode 120 and the upper electrode 150. A pair of P-type thermoelectric leg 130 and N-type thermoelectric leg 140 disposed between the lower electrode 120 and the upper electrode 150 and electrically connected to each other may form a unit cell.

For example, when a voltage is applied to the lower electrode 120 and the upper electrode 150 through lead wires 181 and 182, a substrate in which current flows from the P-type thermoelectric leg 130 to the N-type thermoelectric leg 140 due to the Peltier effect may function as a cooling unit by absorbing heat, and a substrate in which current flows from the N-type thermoelectric leg 140 to the P-type thermoelectric leg 130 may function as a heat-generation part by being heated. Alternatively, when a temperature difference between the lower electrode 120 and the upper electrode 150 is applied, charges in the P-type thermoelectric leg 130 and the N-type thermoelectric leg 140 move due to the Seebeck effect, and electricity may also be generated.

Here, the P-type thermoelectric leg 130 and the N-type thermoelectric leg 140 may be bismuth telluride (Bi—Te)-based thermoelectric legs including bismuth (Bi) and tellurium (Te) as main raw materials. The P-type thermoelectric leg 130 may be a bismuth telluride (Bi—Te)-based thermoelectric leg containing at least one of antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may contain 99 to 99.999 wt % of Bi—Sb—Te, which is a main raw material, and contain 0.001 to 1 wt % of at least one of nickel (Ni), aluminum (Al), copper (Cu), silver (Ag), lead (Pb), boron (B), gallium (Ga), and indium (In) based on 100 wt % of the total weight. The N-type thermoelectric leg 140 may be a bismuth telluride (Bi—Te)-based thermoelectric leg containing at least one of selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may contain 99 to 99.999 wt % of Bi—Se—Te, which is a main raw material, and contain 0.001 to 1 wt % of at least one of nickel (Ni), aluminum (Al), copper (Cu), silver (Ag), lead (Pb), boron (B), gallium (Ga), and indium (In) based on 100 wt % of the total weight.

The P-type thermoelectric leg 130 and the N-type thermoelectric leg 140 may be formed in a bulk type or a stack type. In general, the bulk-type P-type thermoelectric leg 130 or the bulk-type N-type thermoelectric leg 140 may be obtained through a process of manufacturing an ingot by heat-treating a thermoelectric material acquiring a powder for the thermoelectric leg by grinding and sieving the ingot, and sintering the powder for the thermoelectric leg and cutting a sintered body. At this time, the P-type thermoelectric leg 130 and the N-type thermoelectric leg 140 may be polycrystalline thermoelectric legs. As described above, when the P-type thermoelectric leg 130 and the N-type thermoelectric leg 140 are polycrystalline thermoelectric legs, strengths of the P-type thermoelectric leg 130 and the N-type thermoelectric leg 140 may be increased. The stack type P-type thermoelectric leg 130 or the stack type N-type thermoelectric leg 140 may be obtained through a process of forming a unit member by applying a paste including a thermoelectric material on a sheet-shaped base material, and then stacking and cutting the unit member.

At this time, the pair of P-type thermoelectric leg 130 and N-type thermoelectric leg 140 may have the same shape and volume, or different shapes and volumes. For example, since electrical conductivity characteristics of the P-type thermoelectric leg 130 and the N-type thermoelectric leg 140 are different, a height or cross-sectional area of the N-type thermoelectric leg 140 may also be formed differently from a height or cross-sectional area of the P-type thermoelectric leg 130.

At this time, the P-type thermoelectric leg 130 or the N-type thermoelectric leg 140 may have a cylindrical shape, a polygonal column shape, an elliptical column shape, or the like.

The performance of the thermoelectric element according to the embodiment of the present invention may be represented as a figure of merit (ZT). The figure of merit (ZT) may be represented as in Equation 1.

$$ZT = \alpha^2 \cdot \sigma \cdot T/k \qquad \text{[Equation 1]}$$

where α refers to a Seebeck coefficient [V/K], σ refers to the electrical conductivity [S/m], and $\alpha^2\sigma$ refers to a power factor [W/mK$^2$]. In addition, T refers to a temperature, and k refers to the thermal conductivity [W/mK]. k may be represented as a·cp·ρ, a refers to the thermal diffusivity [cm$^2$/S], cp refers to the specific heat [J/gK], and ρ refers to a density [g/cm$^3$].

To obtain the figure of merit of the thermoelectric element, a Z value (V/K) may be measured by using a Z meter, and the figure of merit (ZT) may be calculated by using the measured Z value.

Here, the lower electrode 120 disposed between the lower substrate 110 and the P-type thermoelectric leg 130 and the N-type thermoelectric leg 140, and the upper electrode 150 disposed between the upper substrate 160 and the P-type thermoelectric leg 130 and the N-type thermoelectric leg 140 may contain at least one of copper (Cu), silver (Ag), aluminum (Al), and nickel (Ni), and have a thickness of 0.01 mm to 0.3 mm. When the thickness of the lower electrode 120 or the upper electrode 150 is less than 0.01 mm, a function as an electrode may be degraded, thereby reducing the electrical conduction performance, and when the thickness thereof exceeds 0.3 mm, conduction efficiency may be reduced due to an increase in resistance.

In addition, the lower substrate 110 and the upper substrate 160 facing each other may be metal substrates, and the thickness thereof may be 0.1 mm to 1.5 mm. When the thickness of the metal substrate is less than 0.1 mm or exceeds 1.5 mm, heat dissipation characteristics or thermal conductivity may be excessively increased, thereby reducing the reliability of the thermoelectric element. In addition, when the lower substrate 110 and the upper substrate 160 are the metal substrates, insulating layers 170 may be further formed between the lower substrate 110 and the lower electrode 120 and between the upper substrate 160 and the upper electrode 150, respectively. The insulating layer 170 may include a material having a thermal conductivity of 1 to 20 W/mK. At this time, the insulating layer 170 may be a resin composition containing at least one of an epoxy resin and a silicon resin and an inorganic material, a layer made of a silicon composite containing silicon and an inorganic material, or an aluminum oxide layer. Here, the inorganic material may be at least one of oxide, nitride, and carbide of aluminum, boron, or silicon.

At this time, the sizes of the lower substrate 110 and the upper substrate 160 may also be differently formed. In other words, the volume, thickness, or area of one of the lower substrate 110 and the upper substrate 160 may be formed greater than the volume, thickness, or area of the other. Here, the thickness may be a thickness in a direction from the lower substrate 110 to the upper substrate 160, and the area may be an area in a direction perpendicular to a direction from the substrate 110 to the upper substrate 160. Accordingly, it is possible to improve heat absorption performance or heat dissipation performance of the thermoelectric element. Preferably, the volume, thickness, or area of the lower substrate 110 may be formed greater than at least one of the volume, thickness, and area of the upper substrate 160. At this time, at least one of the volume, thickness, or the area of the lower substrate 110 may be greater than that of the upper substrate 160 when the lower substrate 110 is disposed in a high temperature area for the Seebeck effect, when the lower substrate 110 is applied to a heat-generation area for the Peltier effect, or when a sealing member configured to protect the thermoelectric element from external environments to be described below is disposed on the lower substrate 110. At this time, the area of the lower substrate 110 may be formed in a range of 1.2 to 5 times the area of the upper substrate 160. When the area of the lower substrate 110 is formed to be less than 1.2 times that of the upper substrate 160, the influence on the improvement of heat transfer efficiency is not high, and when the area of the lower substrate 110 exceeds 5 times, the heat transfer efficiency is rather reduced significantly, and it may be difficult to maintain the basic shape of the thermoelectric module.

In addition, a heat dissipation pattern, for example, an uneven pattern, may also be formed on the surface of at least one of the lower substrate 110 and the upper substrate 160. Accordingly, it is possible to improve the heat dissipation performance of the thermoelectric element. When the uneven pattern is formed on a surface coming into contact with the P-type thermoelectric leg 130 or the N-type thermoelectric leg 140, bonding characteristics between the thermoelectric leg and the substrate may also be improved. The thermoelectric element 100 includes the lower substrate 110, the lower electrode 120, the P-type thermoelectric leg 130, the N-type thermoelectric leg 140, the upper electrode 150, and the upper substrate 160.

Although not shown, a sealing member may be further disposed between the lower substrate 110 and the upper substrate 160. The sealing member may be disposed on side surfaces of the lower electrode 120, the P-type thermoelectric leg 130, the N-type thermoelectric leg 140, and the upper electrode 150 between the lower substrate 110 and the upper substrate 160. Accordingly, the lower electrode 120, the P-type thermoelectric leg 130, the N-type thermoelectric leg 140, and the upper electrode 150 may be sealed from external moisture, heat, contamination, and the like.

At this time, the lower substrate 110 disposed on the duct 1100 may be an aluminum substrate, and the aluminum substrate may be bonded to each of the first surface 1110 and the second surface 1120 by the thermal interface material (TIM). Since the aluminum substrate has excellent heat interface performance, the heat transfer between one surface of both surfaces of each of the thermoelectric elements 1210 and 1310 and the duct 1100 through which the first fluid flows is easy. In addition, when the aluminum substrate and the duct 1100 through which the first fluid flows are bonded by the thermal interface material (TIM), the heat transfer between the aluminum substrate and the duct 1100 through which the first fluid flows may not be interrupted. Here, the thermal interface material (TIM) is a material having heat transfer performance and bonding performance, and may be, for example, a resin composition containing at least one of an epoxy resin and a silicon resin and an inorganic material. Here, the inorganic material may be oxide, carbide, or nitride of aluminum, boron, or silicon.

Referring back to FIGS. 3 to 7B, in order to increase the sealing and heat insulation effect between the first thermoelectric module 1200, the duct 1100, and the second thermoelectric module 1300, the power generation module according to the embodiment of the present invention may further include the shield member 1600 and the heat insulating member 1700. The heat insulating member 1700 may be disposed, for example, on a surface of the surfaces of the duct 1100 that excludes areas where the first thermoelectric module 1200 and the second thermoelectric module 1300 are disposed. Accordingly, it is possible to prevent inhibit heat loss of the first fluid and the second fluid, and enhance the power generation performance by increasing the temperature difference between the low-temperature part and the high-temperature part of each of the first thermoelectric module 1200 and the second thermoelectric module 1300. In addition, the shield member 1600 may be disposed on the surface of the surfaces of the duct 1100 that excludes the area where the first thermoelectric module 1200 and the second thermoelectric module 1300 are disposed. Wires and connectors connected to the first thermoelectric module 1200 and the second thermoelectric module 1300 may be protected from external moisture or contamination.

Meanwhile, the guide plate 1800 is a plate for guiding the flow of the second fluid in the fluid passing part 2200, and the second fluid introduced into the fluid passing part 2200 may flow along the guide plate 1800 and then may be discharged.

A first guide plate 1800-1 may be disposed to face the first thermoelectric module 1200, a second guide plate 1800-2 may be disposed to face the second thermoelectric module 1300, and the second fluid may pass between the first thermoelectric module 1200 and the first guide plate 1800-1 and between the second thermoelectric module 1300 and the second guide plate 1800-2.

At this time, both sides of the guide plates 1800-1 and 1800-2 may extend to fluid collection plates 1810-1 and 1810-2 and fluid diffusion plates 1820-1 and 1820-2, respectively. The fluid collection plates 1810-1 and 1810-2 may mean plates extending toward the inlet of the fluid passing part 2200, that is, the first connection part 2400, and the fluid diffusion plates 1820-1 and 1820-2 may mean plates extending toward the outlet of the fluid passing part 2200, that is, the second connection part 2500. At this time, the fluid collection plates 1810-1 and 1810-2, the guide plates 1800-1 and 1800-2, and the fluid diffusion plates 1820-1 and 1820-2 may be integrally connected plates. The first guide plate 1800-1 disposed to face the first thermoelectric module 1200 and the second guide plate 1800-2 disposed to face the second thermoelectric module 1300 may be disposed symmetrically while maintaining a constant distance. Here, a distance between the first guide plate 1800-1 and the second guide plate 1800-2 may be a distance in a horizontal direction from the first guide plate 1800-1 toward the second guide plate 1800-2. Accordingly, the second fluid may pass between the first thermoelectric module 1200 and the first guide plate 1800-1 and between the second thermoelectric module 1300 and the second guide plate 1800-2 at a constant flow rate, thereby obtaining uniform thermoelectric performance. In contrast, a distance between the first fluid collection plate 1810-1 extending from the first guide plate 1800-1 and the second fluid collection plate 1810-2 extending from the second guide plate 1800-2 may be symmetrically disposed to be farther away as it approaches the inlet of the fluid passing part 2200. Here, the distance between the first fluid collection plate 1810-1 and the second fluid collection plate 1810-2 may be a distance in a horizontal direction from the first fluid collection plate 1810-1 toward the second fluid collection plate 1810-2. Likewise, the distance between the first fluid diffusion plate 1820-1 extending from the first guide plate 1800-1 and the second fluid diffusion plate 1820-2 extending from the second guide plate 1800-2 may also be symmetrically disposed to be farther away as it approaches the outlet of the fluid passing part 2200. Accordingly, the second fluid introduced through the inlet of the fluid passing part 2200 may be collected in the fluid collection plates 1810-1 and 1810-2 and then may pass between the thermoelectric modules 1200 and 1300 and the guide plate 1800, and may be diffused from the fluid diffusion plates 1820-1 and 1820-2 and then may be discharged through the outlet of the fluid passing part 2200. Accordingly, since a pressure difference between the second fluids before and after the second fluid passes between the thermoelectric modules 1200 and 1300 and the guide plate 1800 may be minimized, it is possible to inhibit a problem of the second fluid backflowing toward the inlet of the fluid passing part 2200.

At this time, the support frame 1900 supports the first guide plate 1800-1 and the second guide plate 1800-2, the first fluid collection plate 1810-1 and the second fluid collection plate 1810-2, and the first fluid diffusion plate 1820-1 and the second fluid diffusion plate 1820-2. In other words, the support frame 1900 includes a first support frame 1900-1 and a second support frame 1900-2, and the first guide plate 1800-1 and the second guide plate 1800-2, the first fluid collection plate 1810-1 and the second fluid collection plate 1810-2, and the first fluid diffusion plate 1820-1 and the second fluid diffusion plate 1820-2 may be fixed between the first support frame 1900-1 and the second support frame 1900-2.

Meanwhile, in the embodiment of the present invention, the branch part 1400 may branch the second fluid introduced into the fluid passing part 2200. The second fluid branched by the branch part 1400 may pass between the first thermoelectric module 1200 and the first guide plate 1800-1 and between the second thermoelectric module 1300 and the second guide plate 1800-2.

The branch part 1400 may be disposed between the first surface 1110 and the second surface 1120 of the duct 1100. For example, when the third surface 1130 of the duct 1100 is disposed in a direction in which the second fluid flows, the branch part 1400 may be disposed on the third surface 1130 of the duct 1100. Alternatively, the branch part 1400 may also be disposed on the fifth surface 1150 opposite to the third surface 1130 of the duct 1100 according to an aerodynamic principle.

The branch part 1400 may have a shape in which a distance from the third surface 1130 increases from both ends of the third surface 1130 toward a center between both ends of the third surface 1130 on the third surface 1130 of the duct 1100. In other words, the third surface 1130 on which the branch part 1400 is disposed may be substantially perpendicular to the first surface 1110 and the second surface 1120, and the branch part 1400 may be disposed to be inclined with respect to the first surface 1110 and the second surface 1120 of the duct 1100. For example, the branch part 1400 may have an umbrella shape or a roof shape. Accordingly, the second fluid, for example, waste heat, may be branched through the branch part 1400, and guided to come into contact with the first thermoelectric module 1200 and the second thermoelectric module 1300 disposed on both surfaces of the power generation apparatus. In other words, the second fluid may be branched through the branch part 1400 to pass between the first thermoelectric module 1200 and the first guide plate 1800-1 and between the second thermoelectric module 1300 and the second guide plate 1800-2.

Meanwhile, a width W1 between an outside of the first heat sink 1220 of the first thermoelectric module 1200 and an outside of the second heat sink 1320 of the second thermoelectric module 1300 may be greater than a width W2 of the branch part 1400. Here, each of the outside of the first heat sink 1220 and the outside of the second heat sink 1320 may mean an opposite side of the side facing the duct 1100. Here, each of the first heat sink 1220 and the second heat sink 1320 may include a plurality of heat dissipation fins, and the plurality of heat dissipation fins may be formed in a direction that does not interfere with the flow of gas. For example, the plurality of heat dissipation fins may have a plate shape extending in a second direction in which the gas flows. Alternatively, the plurality of heat dissipation fins may also have a shape that is folded so that a flow path is formed in the second direction in which the gas flows. At this time, the maximum width W1 between the first heat sink 1220 of the first thermoelectric module 1200 and the second heat sink 1320 of the second thermoelectric module 1300 may mean a distance from the farthest point of the first heat sink 1220 to the farthest point of the second heat sink 1320 with respect to the duct 1100, and the maximum width W2 of the branch part 1400 may mean the width of the branch part 1400 in an area closest to the third surface 1130 of the duct 1100. Accordingly, the flow of the second fluid may be directly transmitted to the first heat sink 1220 and the second heat sink 1320 without being interrupted by the branch part 1400. Accordingly, the contact area between the second fluid and the first heat sink 1220 and the second heat sink 1320 is increased, so that an amount of heat received by the first heat sink 1220 and the second heat sink 1320 from the second fluid may increase, and the power generation efficiency may be increased.

Meanwhile, the first guide plate 1800-1 may be symmetrically disposed to be spaced apart from the first heat sink 1220 of the first thermoelectric module 1200 by a predetermined interval, and the second guide plate 1800-2 may be symmetrically disposed to be spaced apart from the second heat sink 1320 of the second thermoelectric module 1300 by a predetermined interval. Here, the interval between the guide plates 1800-1 and 1800-2 and the heat sink of each thermoelectric module may affect the flow rate of the second fluid coming into contact with the heat sink of each thermoelectric module and a differential pressure of the second fluid, thereby affecting the power generation performance.

In the embodiment of the present invention, the power generation apparatus in which the thermoelectric module is disposed on the surface of the duct generates electricity using the temperature difference between the first fluid passing through the inside of the duct and the second fluid passing through the heat sink of the thermoelectric module. At this time, a wiring part is connected to the thermoelectric element of the thermoelectric module, and the wiring part needs to be drawn out to be connected to an external power source.

The embodiment of the present invention intends to propose a drawn-out structure of the wiring part for minimizing a flow resistance of the second fluid and minimizing damage to the wiring part due to the high-temperature second fluid.

Figure 10:
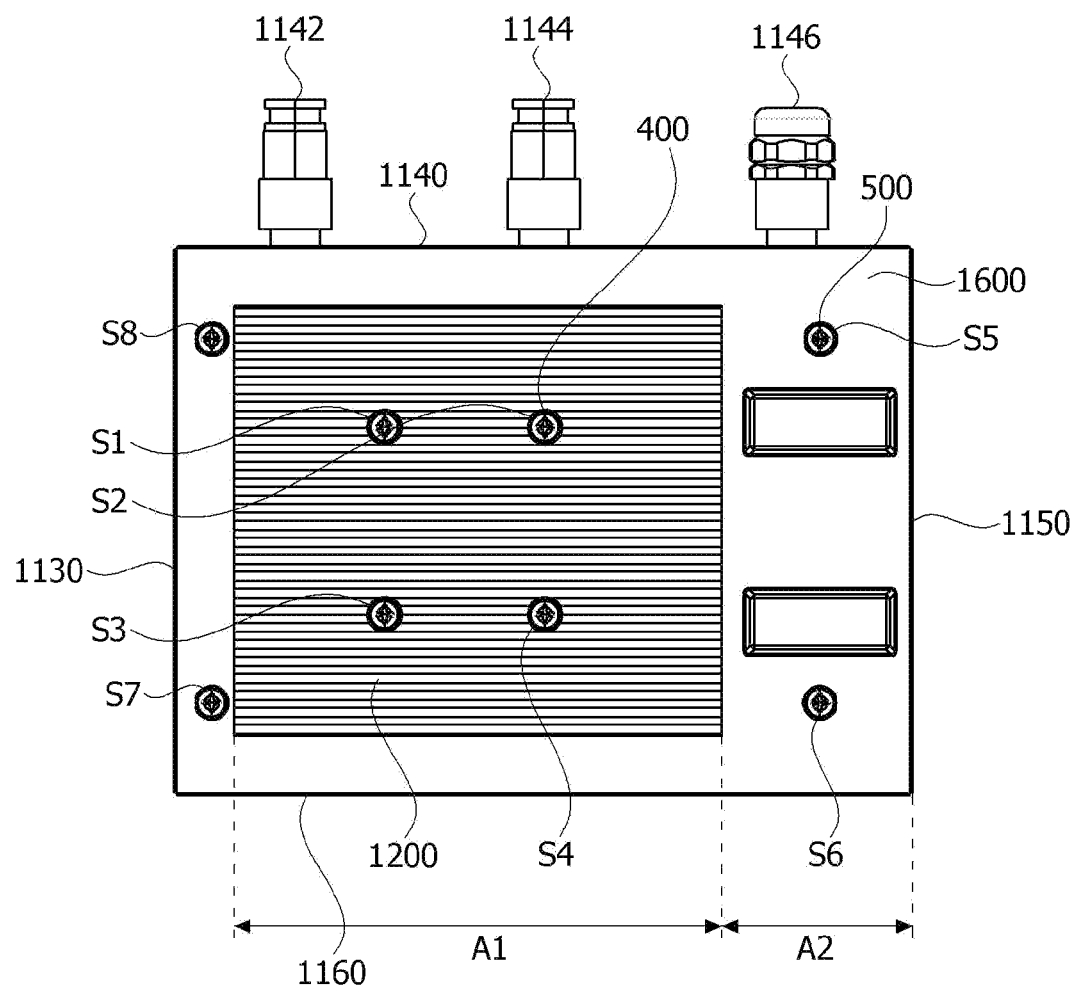
FIG. 10 is a top view of the power generation apparatus according to one embodiment of the present invention.
Figure 11:
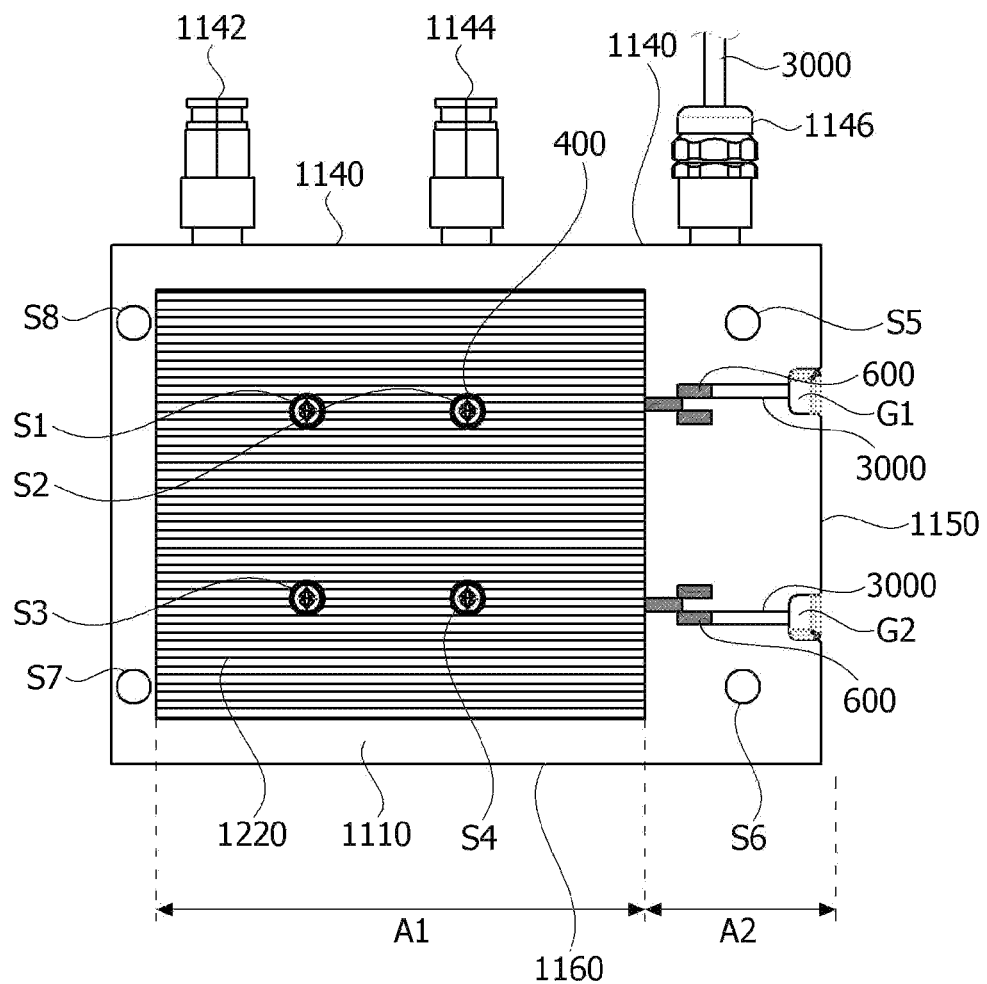
FIG. 11 is a top view of a state in which a shield member has been removed from the power generation apparatus according to one embodiment of the present invention.
Figure 13:
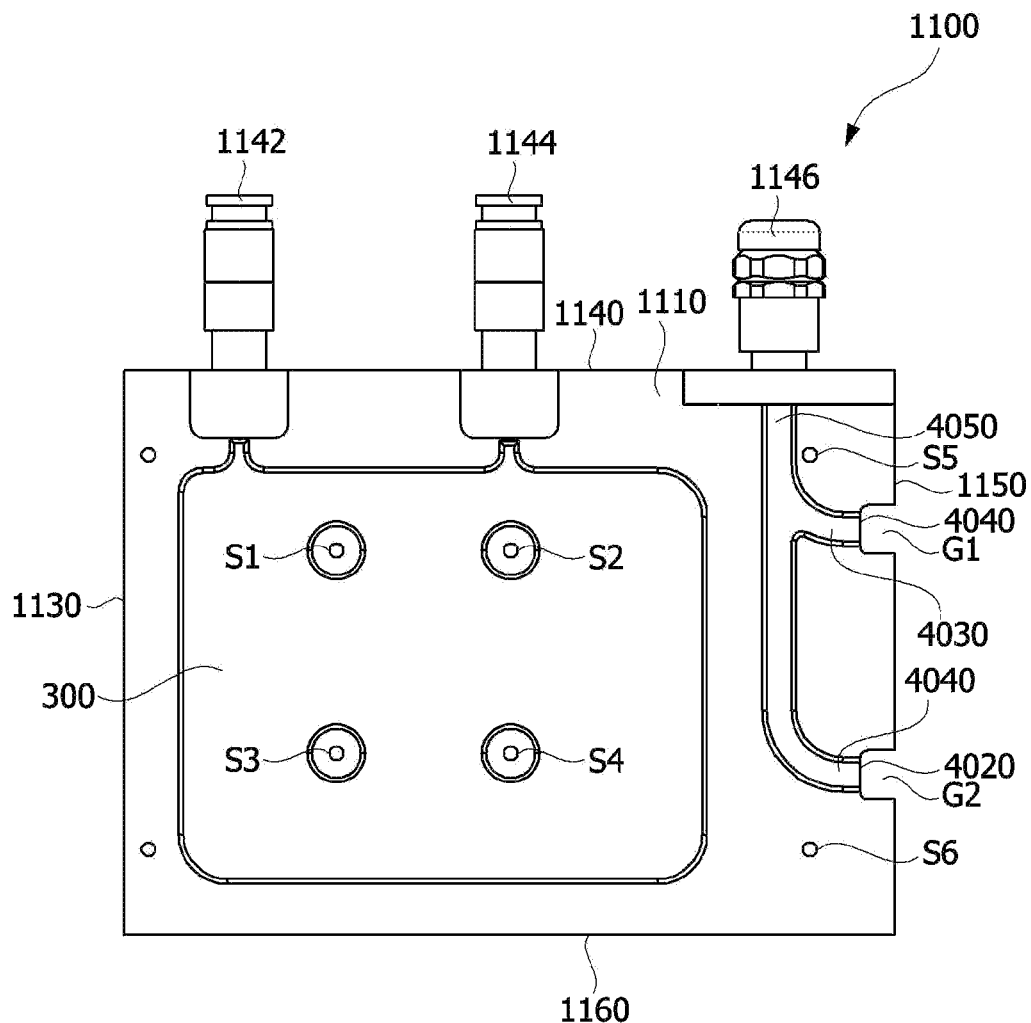
FIG. 13 shows another example of the cross-sectional view of the cooling unit included in the power generation apparatus according to one embodiment of the present invention.

FIG. 10 is a top view of the power generation apparatus according to one embodiment of the present invention, FIG. 11 is a top view of a state in which a shield member has been removed from the power generation apparatus according to one embodiment of the present invention, FIG. 12 shows an example of a cross-sectional view of a cooling unit included in the power generation apparatus according to one embodiment of the present invention, and FIG. 13 shows another example of the cross-sectional view of the cooling unit included in the power generation apparatus according to one embodiment of the present invention.

Referring to FIGS. 10 to 13, the power generation apparatus according to one embodiment of the present invention includes a cooling unit 1100 and a first thermoelectric module 1200 disposed on a first surface 1110 of the cooling unit 1100. As described with reference to FIGS. 1 to 9, the cooling unit 1100 may be referred to as the duct 1100 in this specification. Although not shown in FIGS. 10 to 13, referring to FIGS. 1 to 9, a second thermoelectric module 1300 may be further provided on a second surface 1120 facing the first surface 1110 of the cooling unit 1100.

A fluid inlet 1142 and a fluid outlet 1144 are disposed to be spaced apart from each other on another surface perpendicular to the first surface 1110 of the cooling unit 1100, that is, a fourth surface 1140, and a fluid receiving part 300 connected to the fluid inlet 1142 and the fluid outlet 1144 is disposed inside the cooling unit 1100. In this specification, since the first thermoelectric module 1200 and the second thermoelectric module 1300 are disposed on the first surface 1110 and the second surface 1120 of the cooling unit 1100, the first surface 1110 and the second surface 1120 of the cooling unit 1100 may be referred to as one surface and the other surface of the cooling unit 1100. In addition, third to sixth surfaces 1130 to 1160 between the first surface 1110 and the second surface 1120 of the cooling unit 1100 may be referred to as side surfaces or outer surfaces of the cooling unit 1100. Alternatively, in this specification, the first surface 1110 to the sixth surface 1160 of the cooling unit 1100 may be referred to as a first face 1110 to a sixth face 1160, respectively. In this specification, the first to sixth surfaces are arbitrarily named for convenience of description, and are not limited thereto.

The first fluid introduced into the fluid inlet 1142 may pass through the fluid receiving part 300 and then may be discharged through the fluid outlet 1144. Here, the arrangement order of the fluid inlet 1142 and the fluid outlet 1144 is not limited as shown, and positions of the fluid inlet 1142 and the fluid outlet 1144 may also be opposite. The fluid inlet 1142, the fluid outlet 1144, and a wiring drawn-out part 1146 are formed to protrude from the fourth surface 1140 of the cooling unit 1100. Accordingly, in this specification, the fluid inlet 1142, the fluid outlet 1144, and the wiring drawn-out part 1146 may be referred to as a protrusion.

As shown in FIG. 12, the fluid receiving part 300 may have a shape of a flow path tube that is connected from the fluid inlet 1142 up to the fluid outlet 1144 and disposed to circulate the cooling unit 1100. Alternatively, as shown in FIG. 13, the fluid receiving part 300 may also have a water tank shape that is connected to the fluid inlet 1142 and the fluid outlet 1144 and has an inner area filled with the first fluid. Alternatively, the fluid receiving part 300 may also have various types of flow path tube shapes.

An area occupied by the fluid receiving part 300, a diameter of the flow path tube, a length of the flow path tube, an arrangement shape of the flow path tube, and the like may be variously changed depending on the flow velocity and flow rate of the first fluid introduced into the fluid receiving part 300.

In the embodiment of the present invention, the fluid receiving part 300 may be disposed in a first area A1 of the cooling unit 1100, the first thermoelectric module 1200 may be disposed on the first surface 1110 of the first area A1 of the cooling unit 1100, and the second thermoelectric module 1300 may be disposed on the second surface 1120 of the first area A1 of the cooling unit 1100. As described above, an area through which the first fluid passes in the cooling unit 1100 and an area where the thermoelectric leg of the first thermoelectric module 1200 is disposed may overlap. Meanwhile, the second fluid having a temperature higher than that of the first fluid passing through the inside of the cooling unit 1100 may pass through a first heat sink 1220 of the first thermoelectric module 1200 in a direction from the third surface 1130 toward the fifth surface 1150 facing the third surface 1130. Accordingly, electricity may be generated by the temperature difference between the low-temperature part and the high-temperature part of the first thermoelectric module 1200.

Meanwhile, a coupling member 400 may be used for coupling the cooling unit 1100 and the first thermoelectric module 1200. To symmetrically dispose the first thermoelectric module 1200 and the second thermoelectric module 1300 on the first surface 1110 and the second surface 1120 of the cooling unit 1100, the coupling member 400 may be disposed to pass through the thermoelectric module 1200, the cooling unit 1100, and the second thermoelectric module 1300, and to this end, the cooling unit 1100 may be formed with a plurality of through holes S1 to S4 through which the coupling member 400 passes. The plurality of through holes S1 to S4 may be disposed to pass through both surfaces of the cooling unit 1100 in which the first thermoelectric module 1200 and the second thermoelectric module 1300 are disposed.

At this time, the plurality of through holes S1 to S4 may be disposed to be spaced apart from the fluid receiving part 300 in the first area A1 of the cooling unit 1100. In other words, the plurality of through holes S1 to S4 may be formed independently of the fluid receiving part 300, so that it is possible to inhibit a problem in which the first fluid passing through the fluid receiving part 300 flows out through the plurality of through holes S1 to S4.

A first wiring part 1300 may be connected to a first thermoelectric element 1210 of the first thermoelectric module 1200, and the first wiring part 1300 may be drawn out to the outside and connected to an external power source.

When the first thermoelectric module 1200 is disposed in the first area A1 on the first surface 1110 of the cooling unit 1100, the first wiring part 1300 may be disposed in a second area A2 on the first surface 1110 of the cooling unit 1100, and a shield member 1600 configured to cover the first wiring part 1300 may be further disposed in the second area A2 on the first surface 1110 of the cooling unit 1100. At this time, the second area A2 may be an area disposed on a side surface of the first area A1.

At this time, a coupling member 500 may be used for coupling between the cooling unit 1100 and the shield member 1600, and a plurality of through holes S5 to S8 through which the coupling member 500 configured to couple the cooling unit 1100 and the shield member 1600 passes may be formed in the second area A2 of the cooling unit 1100. At this time, the plurality of through holes S5 and S6 may be disposed in consideration of the position of the wiring. In other words, the wiring connected to the thermoelectric module may include a connection electrode connected to the thermoelectric element of the thermoelectric module, a connector disposed on the connection electrode, and a wire connected to the connector. At this time, the plurality of through holes S5 and S6 may be disposed to avoid the position of the connector. Accordingly, the through hole S5 may be disposed closer to the fourth surface 1140 than the plurality of through holes S1 and S2, and the through hole S6 may be disposed closer to the sixth surface 1160 than the plurality of through holes S3 and S4.

Here, the positions and numbers of the plurality of through holes S1 to S8 are illustrative, and the embodiment of the present invention is not limited thereto.

As described above, the first wiring part 1300 may be connected to the first thermoelectric element 1210 of the first thermoelectric module 1200, and the first wiring part 1300 may be drawn out to the outside and connected to an external power source. Here, the first wiring part 3000 may be connected to a connector (not shown) disposed on a connection electrode 600 connected to the first thermoelectric element 1210.

In the embodiment of the present invention, a tunnel 4000 through which the first wiring part 3000 passes is formed inside the cooling unit 1100. The tunnel 4000 may be formed in the second area A2 of the cooling unit 1100. In addition, the wiring drawn-out part 1146 may be further disposed on the other surface perpendicular to the first surface 1110 of the cooling unit 1100, that is, the fourth surface 1140, and the tunnel 4000 may be connected to the wiring drawn-out part 1146. Accordingly, the first wiring part 3000 connected to the first thermoelectric element 1220 may be disposed in the second area A2 on the first surface 1110 of the cooling unit 1100, and may pass through the tunnel 4000 and may be drawn out through the wiring drawn-out part 1146.

At this time, the wiring drawn-out part 1146, the fluid inlet 1142, and the fluid outlet 1144 may be disposed to be spaced apart from each other on the same surface. The fluid inlet 1142 and the fluid outlet 1144 may be disposed in the first area A1 of the cooling unit 1100, and the wiring drawn-out part 1146 may be disposed in the second area A2 of the cooling unit 1100.

As described above, when the first wiring part 3000 connected to the first thermoelectric module 1200 is drawn out to the outside through the tunnel 4000 in the cooling unit 1100, it is possible to minimize the flow resistance of the second fluid due to the first wiring part 3000. In addition, an area in which the first wiring part 3000 comes into contact with the second fluid may be minimized, thereby inhibiting damage to the first wiring part 3000 due to the high-temperature second fluid.

In the embodiment of the present invention, the tunnel 4000 may be formed to pass through the second area A2 between the first surface 1110 and the second surface 1120 of the cooling unit 1100. The tunnel 4000 may be formed to extend up to the wiring drawn-out part 1146 in a direction from the fifth surface 1150 toward the fourth surface 1140 in the second area A2 between the first surface 1110 and the second surface 1120 of the cooling unit 1100.

When the first wiring part 3000 is connected to the first thermoelectric element 1210 and includes two wirings disposed to be spaced apart from each other, the tunnel 4000 may include a first inlet 4010 through which one wiring is introduced, and a second inlet 4020 through which the other wiring is introduced. The first inlet 4010 and the second inlet 4020 may be disposed to be spaced apart from each other, a first tunnel 4030 extending in the second area A2 in a direction from the first inlet 4010 toward the third surface 1130 of the cooling unit 1100 and a second tunnel 4040 extending in the second area A2 in a direction from the second inlet 4020 toward the third surface 1130 of the cooling unit 1100 may be joined in a third tunnel 4050, and the third tunnel 4050 may extend toward the fourth surface 1140 and may be connected to the wiring drawn-out part 1146.

At this time, the first inlet 4010 and the second inlet 4020 may be formed at an edge of the second area A2 of the cooling unit 1100, that is, in a first groove G1 and a second groove G2 formed on the fifth surface 1150. Accordingly, it is possible to inhibit the first wiring part 3000 from protruding from the fifth surface 1150 in a process of being introduced into the tunnel 4000 in the cooling unit 1100.

Meanwhile, as described above, the first thermoelectric module 1200 may be disposed on the first surface 1110 of the cooling unit 1100, and the second thermoelectric module 1300 may be disposed on the second surface 1120 of the cooling unit 1100. At this time, the first wiring part 3000 connected to the first thermoelectric module 1200 and a second wiring part 3100 connected to the second thermoelectric module 1300 may be drawn out to the outside through the tunnel 4000 and the wiring drawn-out part 1146.

Figure 14:
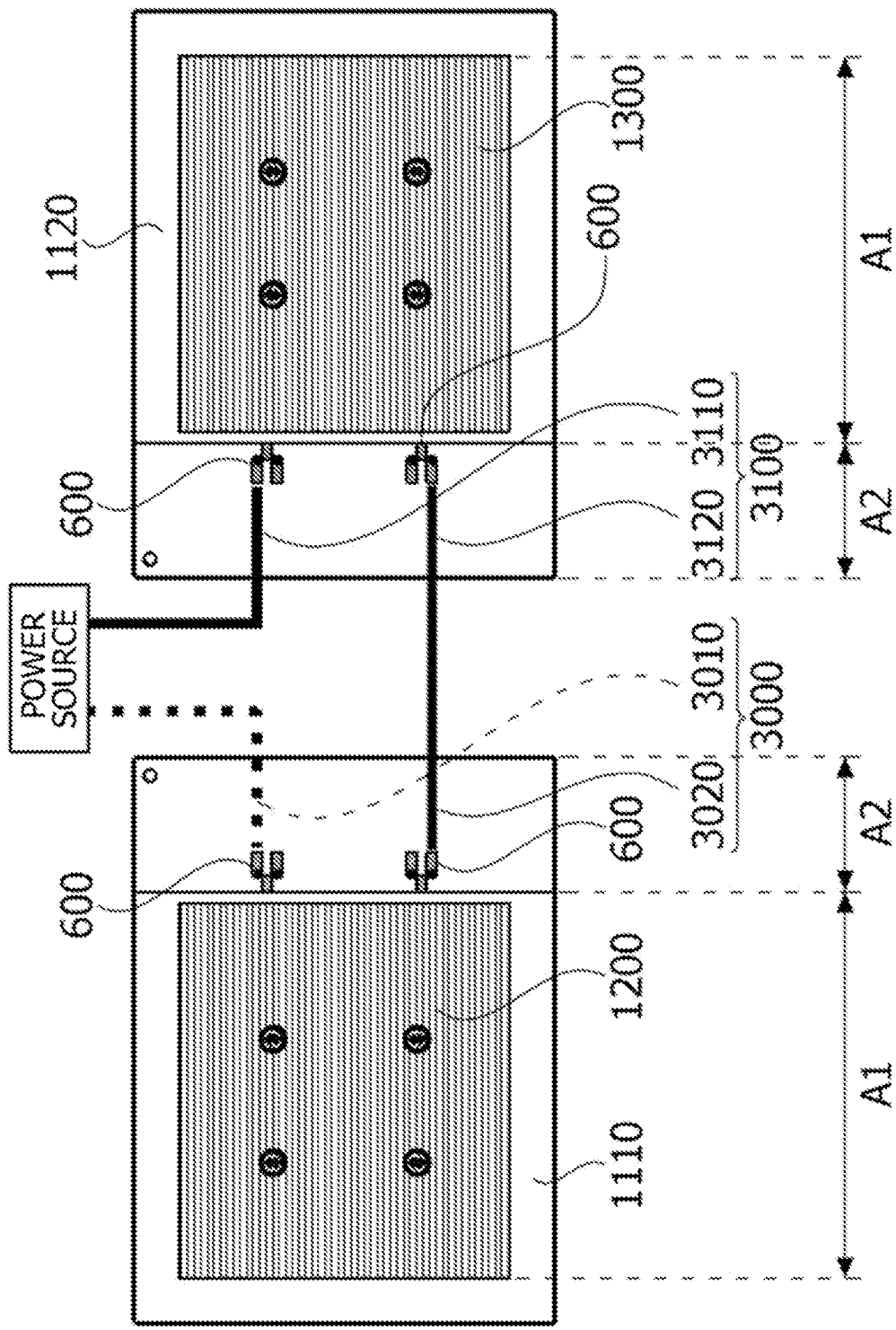
FIG. 14 is a view for describing the wiring connection between a first thermoelectric module and a second thermoelectric module according to one embodiment of the present invention.

FIG. 14 is a view for describing the wiring connection between the first thermoelectric module and the second thermoelectric module according to one embodiment of the present invention, and FIG. 15 is a plan view and a perspective view of the power generation apparatus according to the embodiment of FIG. 14.

Referring to FIGS. 14 and 15, the first thermoelectric module 1200 is disposed on the first surface 1110 of the cooling unit 1100, and the second thermoelectric module 1300 is disposed on the second surface 1120 of the cooling unit 1100 to be symmetrical to the first thermoelectric module 1200. In other words, the second thermoelectric module 1300 may be disposed in the first area A1 on the second surface 1120, and the second wiring part 3100 may be disposed in the second area A2 of the second surface 1120.

At this time, the first thermoelectric module 1200 and the second thermoelectric module 1300 may be connected in series.

In other words, when the first wiring part 3000 includes a 1-1 wiring 3010 and a 1-2 wiring 3020 and the second wiring part 3100 includes a 2-1 wiring 3110 and a 2-2 wiring 3120, the 1-1 wiring 3010 and the 2-1 wiring 3110 may have different polarities, and the 1-2 wiring 3020 and the 2-2 wiring 3120 may have the same polarity and have the same polarity as that of the 1-1 wiring 3010 or the 2-1 wiring 3110.

At this time, the 1-1 wiring 3010 and the 2-1 wiring 3110 are drawn out to the wiring drawn-out part 1146 through the tunnel 4000, and the 1-2 wiring 3020 and the 2-2 wiring 3120 may be connected to each other. Accordingly, the first thermoelectric module 1200 and the second thermoelectric module 1300 may be connected in series.

Figure 16:
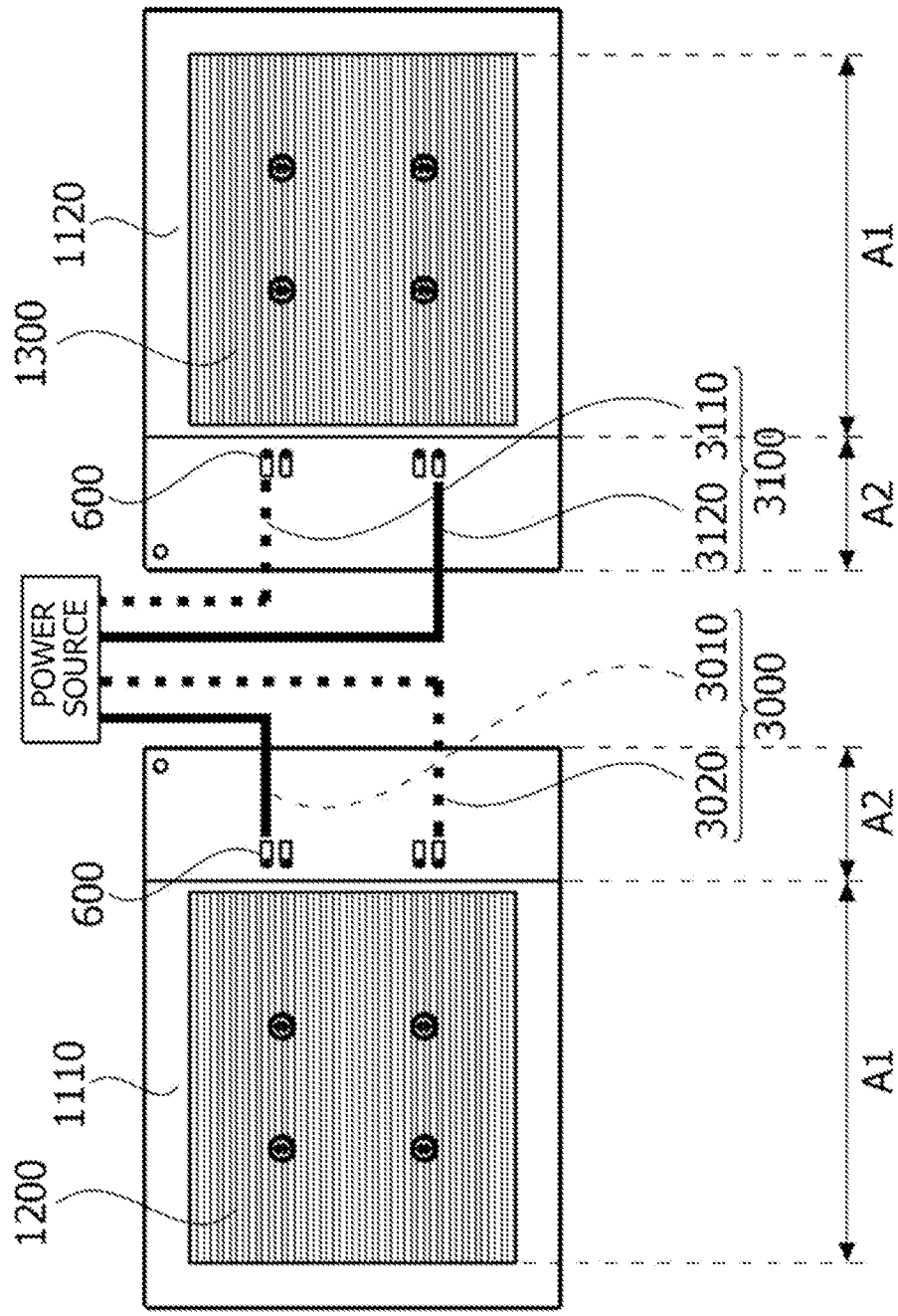
FIG. 16 is a view for describing the wiring connection between a first thermoelectric module and a second thermoelectric module according to another embodiment of the present invention.

FIG. 16 is a view for describing the wiring connection between a first thermoelectric module and a second thermoelectric module according to another embodiment of the present invention, and FIG. 17 is a plan view and a perspective view of the power generation apparatus according to the embodiment of FIG. 16.

Referring to FIGS. 16 and 17, the first thermoelectric module 1200 is disposed on the first surface 1110 of the cooling unit 1100, and the second thermoelectric module 1300 is disposed on the second surface 1120 of the cooling unit 1100 to be symmetrical to the first thermoelectric module 1200. In other words, the second thermoelectric module 1300 may be disposed in the first area A1 on the second surface 1120, and the second wiring part 3100 may be disposed in the second area A2 of the second surface 1120.

At this time, the first thermoelectric module 1200 and the second thermoelectric module 1300 may be connected in parallel.

In other words, when the first wiring part 3000 includes the 1-1 wiring 3010 and the 1-2 wiring 3020, and the second wiring part 3100 includes the 2-1 wiring 3110 and the 2-2 wiring 3120, the 1-1 wiring 3010 and the 1-2 wiring 3020 may have different polarities, and the 2-1 wiring 3110 and the 2-2 wiring 3120 may have different polarities.

Each of the 1-1 wiring 3010 and the 1-2 wiring 3020 may be drawn-out to the wiring drawn-out part 1146 through the tunnel 4000, and each of the 2-1 wiring 3110 and the 2-2 wiring 3120 may be drawn out to the wiring drawn-out part 1146 through the tunnel 4000.

Accordingly, the first thermoelectric module 1200 and the second thermoelectric module 1300 may be connected in parallel.

As described above, when the first wiring part 3000 and the second wiring part 3100 are drawn out to the outside through the tunnel 4000 inside the cooling unit 1100, it is possible to minimize a problem in which the flow resistance of the second fluid is generated due to the first wiring part 3000 and the second wiring part 3100, and inhibit a problem in which the first wiring part 3000 and the second wiring part 3100 are disposed close to the high-temperature second fluid and thus damaged.

Figure 18:
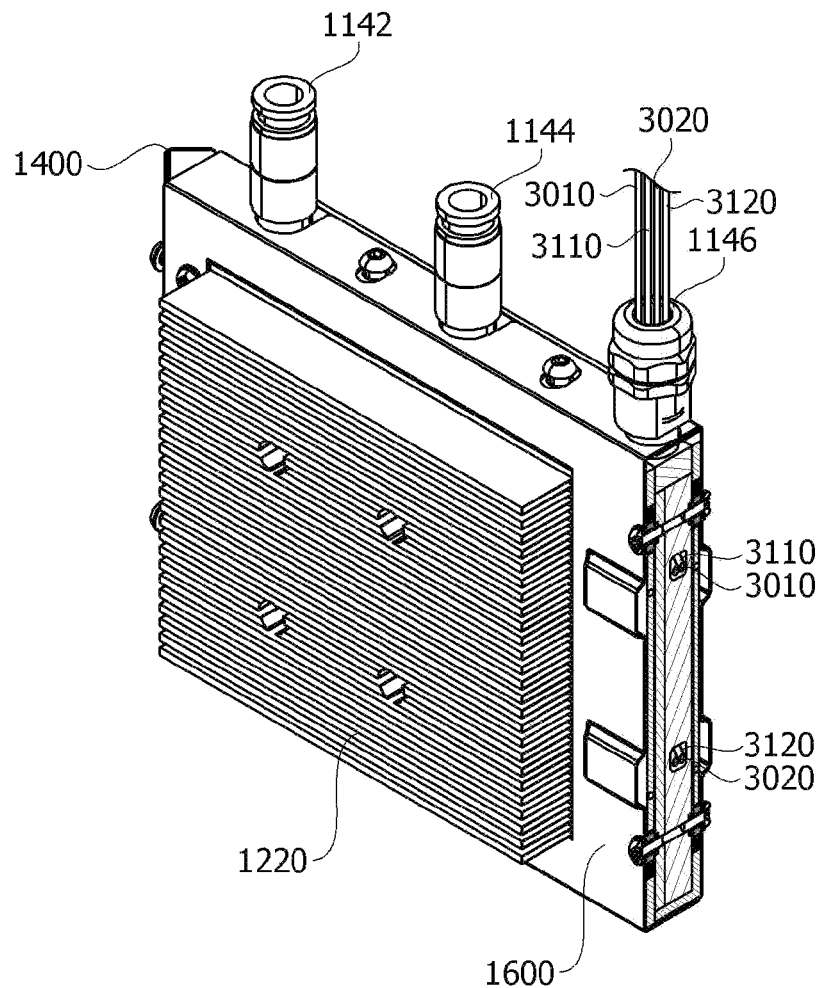
FIG. 18 is a perspective view for describing a cross section of FIG. 10.
Figure 19:
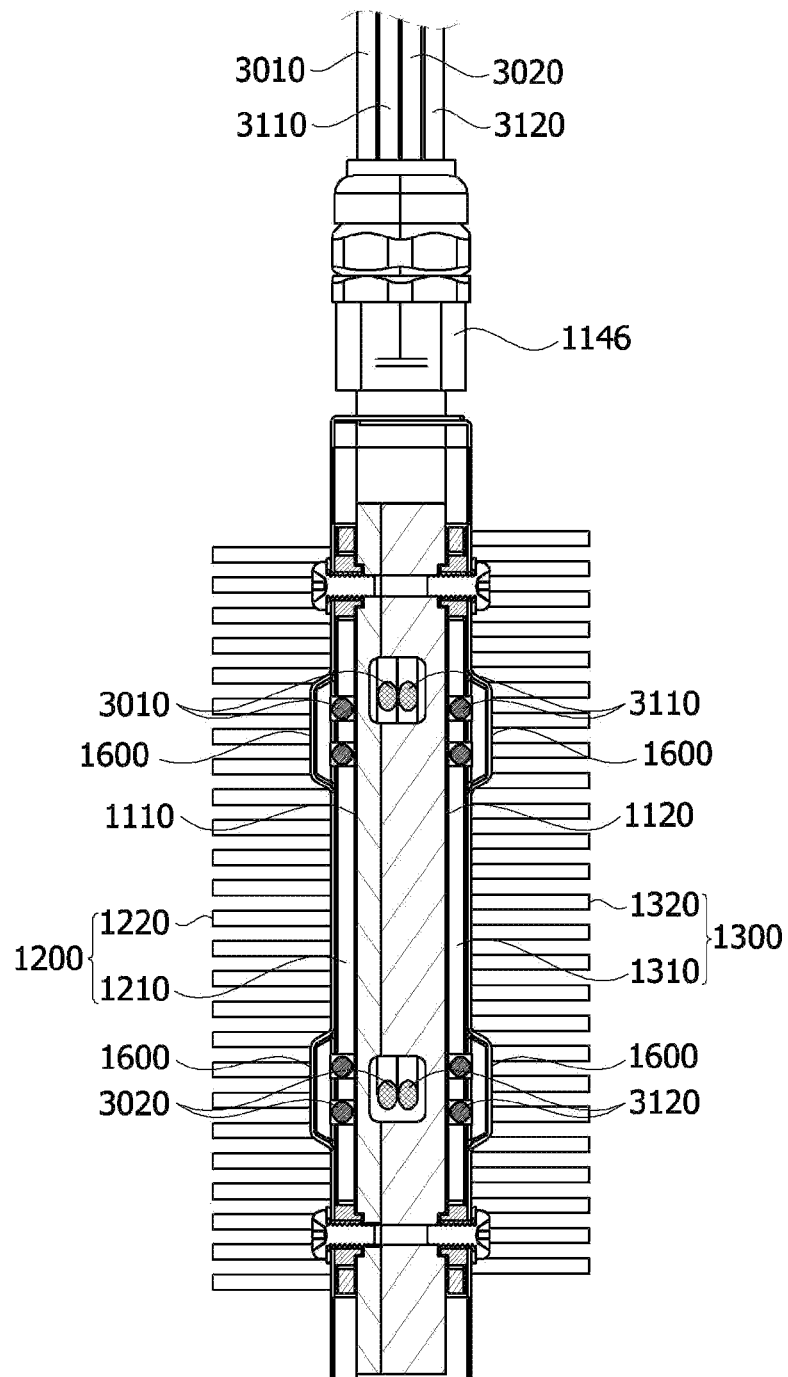
FIG. 19 is a cross-sectional view for describing the cross section of FIG. 10.

FIG. 18 is a perspective view for describing a cross section of FIG. 10, and FIG. 19 is a cross-sectional view for describing the cross section of FIG. 10. Here, the first thermoelectric module and the second thermoelectric module will be described as being parallel-connected as in the embodiment of FIGS. 16 and 17 as an example, and a cross section with respect to the fluid outlet 1146 of FIG. 10 will be exemplified.

Referring to FIGS. 18 and 19, the first wiring part 3000 and the second wiring part 3000 are each covered by the shield member 1600 on the first surface 1110 and the second surface 1120 of the cooling unit 1100 and drawn out to the wiring drawn-out part 1146 through the tunnel 4000 formed in the cooling unit 1100. The shield member 1600 may be formed with a stepped portion in the area where the first wiring part 3000 and the second wiring part 3000 are disposed to cover the first wiring part 3000 and the second wiring part 3000. Accordingly, it can be seen that the first wiring part 3000 and the second wiring part 3000 do not interfere with the flow path of the second fluid, and the first wiring part 3000 and the second wiring part 3000 are not affected by the high-temperature second fluid.

Meanwhile, although one power generation apparatus has been mainly described above, the present invention is not limited thereto. A plurality of power generation apparatuses may also be disposed within one fluid passing part 2200.

Figure 20:
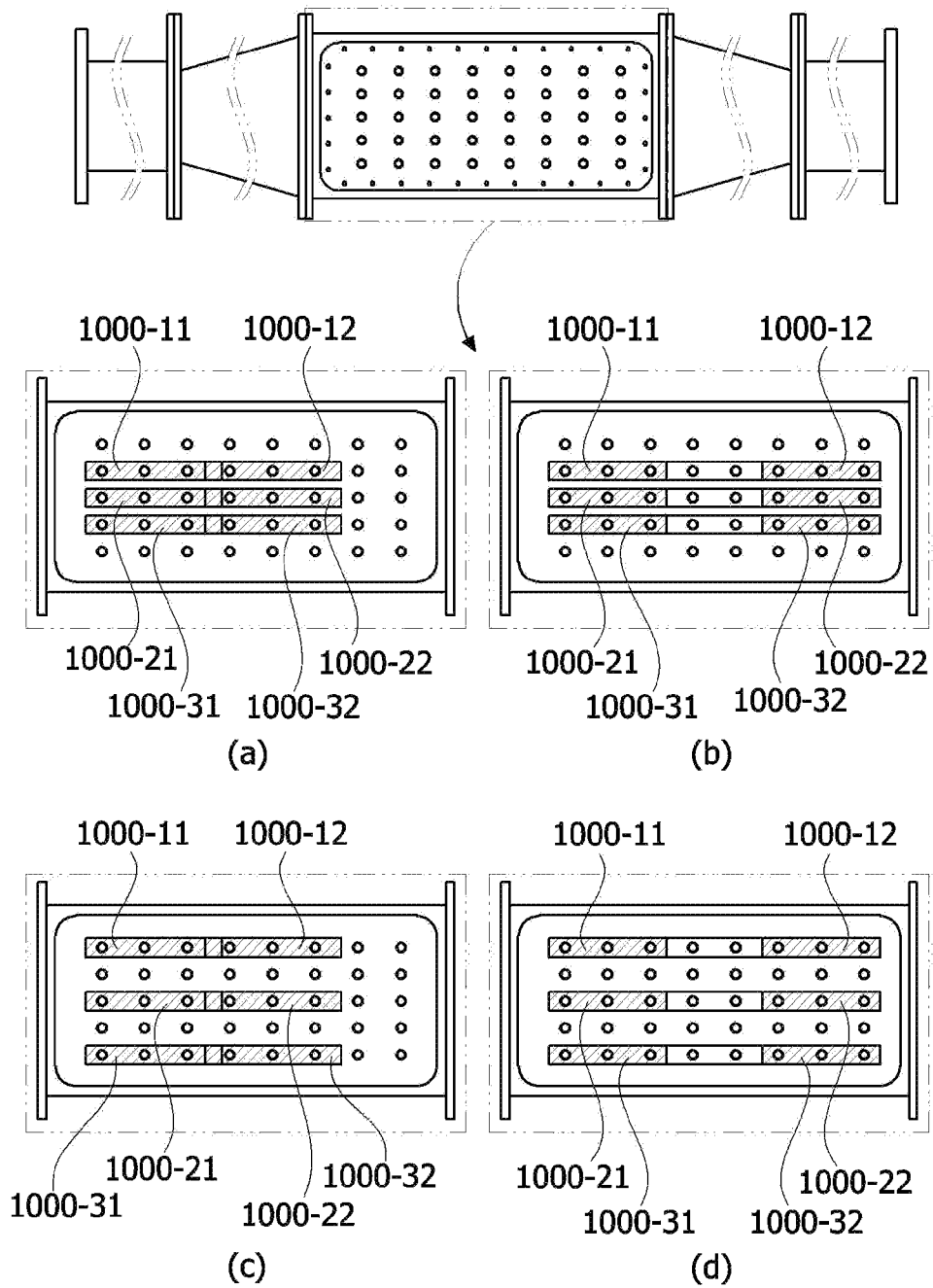
FIG. 20 shows a power generation system according to another embodiment of the present invention.
Figure 21:
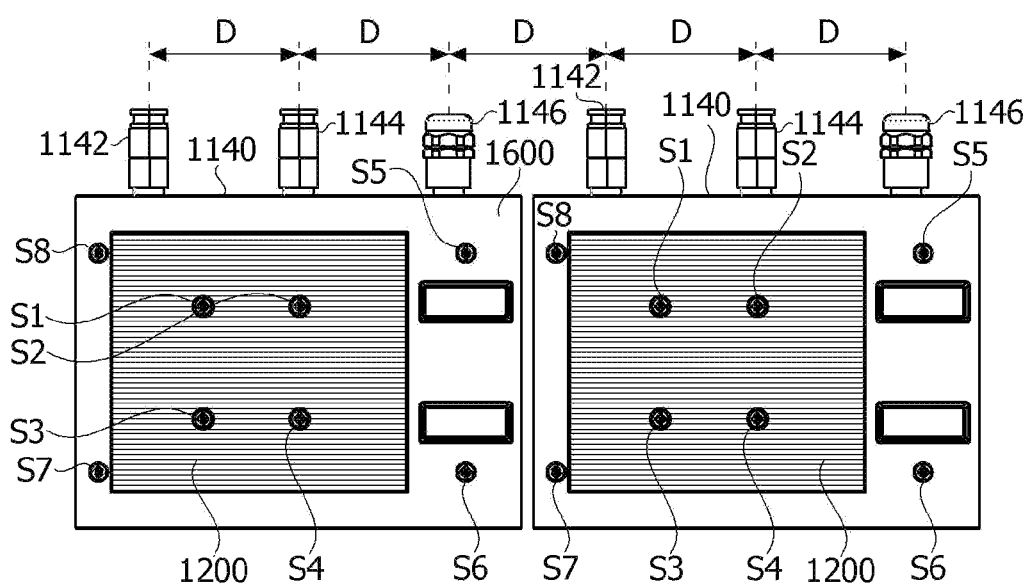
FIG. 21 shows two power generation apparatuses included in the power generation system according to another embodiment of the present invention.

FIG. 20 shows a power generation system according to another embodiment of the present invention, and FIG. 21 shows two power generation apparatuses included in the power generation system according to another embodiment of the present invention.

Referring to FIGS. 20 and 21, the power generation system may include a plurality of power generation apparatuses, and each power generation apparatus may be the same as the power generation apparatus described with reference to FIGS. 1 to 19.

Referring to FIG. 20, a plurality of power generation apparatuses 1000-11 and 1000-21 may be disposed in a direction in which the second fluid flows in the fluid passing part 2200.

In addition, a plurality of power generation apparatuses 1000-11, 1000-12, and 1000-13 may also be disposed in parallel to be spaced apart from each other in the fluid passing part 2200. The arrangement structure and the number of the plurality of power generation apparatuses may vary depending on the amount of power generation or the like.

Meanwhile, referring to FIG. 21, a distance D between the fluid inlet 1142 and the fluid outlet 1144 of each power generation apparatus may be equal to a distance D between the fluid outlet 1144 and the wiring drawn-out part 1146. When the positions of the fluid inlet 1142 and the fluid outlet 1144 are opposite to those shown, the distance D between the fluid inlet 1142 and the fluid outlet 1144 may be equal to the distance D between the fluid inlet 1142 and the wiring drawn-out part 1146.

In addition, the distance D between the fluid outlet 1144 and the wire drawn-out part 1146 may be equal to the distance between the wiring drawn-out part 1146 and the fluid inlet 1142 of a neighboring power generation apparatus. When the positions of the fluid inlet 1142 and the fluid outlet 1144 are opposite to those shown, the distance D between the fluid inlet 1142 and the wiring drawn-out part 1144 may be equal to the distance D between the wiring drawn-out part 1144 and the fluid outlet 1146 of a neighboring power generation apparatus.

Accordingly, it is possible to variably design the number and positions of the plurality of power generation apparatuses in the power generation system as shown in FIGS. 20A to 20D.

The power generation system may generate power through a heat source generated from ships, vehicles, power plants, geothermal heat, and the like, and a plurality of power generation apparatuses may be disposed to efficiently converge the heat source. At this time, when the wiring connected to each thermoelectric element is drawn out to the outside through the tunnel in the cooling unit, it is possible to minimize the protruding area on the flow path of the second fluid to reduce the flow resistance of the second fluid, so that it is possible to improve the efficiency and reliability of the power generation apparatus, and thus improve the fuel efficiency of a transport apparatus such as a ship or a vehicle. Accordingly, it is possible to reduce transportation costs and create eco-friendly industrial environments in the shipping and transportation industries, and reduce material costs when applied to manufacturing industries such as steel mills.

Although the above has been described with reference to preferred embodiments of the present invention, those skilled in the art will understand that the present invention may be variously modified and changed without departing from the spirit and scope of the present invention described in the appended claims.

The invention claimed is:

1. A power generation apparatus comprising:
a cooling unit including a first surface, a second surface facing the first surface, a third surface between the first surface and the second surface, a fourth surface perpendicular to the third surface between the first surface and the second surface, a fifth surface facing the third surface, and a sixth surface facing the fourth surface;
a first thermoelectric module including a first thermoelectric element disposed on the first surface of the cooling unit and a first heat sink disposed on the first thermoelectric element;
a second thermoelectric module including a second thermoelectric element disposed on the second surface of the cooling unit and a second heat sink disposed on the second thermoelectric element;
a first wiring part connected to the first thermoelectric module;
a fluid inlet, a fluid outlet, and a wiring drawn-out part disposed to be spaced apart from one another on the fourth surface of the cooling unit;
a fluid receiving part disposed in a first area of the cooling unit; and
a tunnel disposed in a second area of the cooling unit, wherein the tunnel is connected to the wiring drawn-out part by passing in a direction from the fifth surface toward the fourth surface between the first surface and the second surface of the cooling unit,
wherein the tunnel includes a first inlet and a second inlet disposed to be spaced apart from each other on the fifth surface, and
wherein the first wiring part passes through the tunnel through at least one of the first inlet and the second inlet.

2. The power generation apparatus of claim 1, wherein a distance between the fluid inlet and the fluid outlet is equal to a distance between the fluid inlet or the fluid outlet and the wiring drawn-out part.

3. The power generation apparatus of claim 1, comprising:
a second wiring part connected to the second thermoelectric module,
wherein the second wiring part passes through the tunnel through at least one of the first inlet and the second inlet.

4. The power generation apparatus of claim 3, wherein the second thermoelectric module is disposed in the first area of the cooling unit.

5. The power generation apparatus of claim 4, wherein the first wiring part includes a first wiring and a second wiring connected to the first thermoelectric element,
wherein the second wiring part includes a third wiring and a fourth wiring connected to the second thermoelectric element,
wherein the first wiring and the third wiring are drawn out to the wiring drawn-out part through the tunnel, and
wherein the second wiring and the fourth wiring are connected to each other.

6. The power generation apparatus of claim 4, wherein the first wiring part includes a first wiring and a second wiring connected to the first thermoelectric element,
wherein the second wiring part includes a third wiring and a fourth wiring connected to the second thermoelectric element,
wherein the first wiring and the second wiring have different polarities, and the third wiring and the fourth wiring have different polarities, and
wherein the first wiring, the second wiring, the third wiring, and the fourth wiring are drawn out to the wiring drawn-out part through the tunnel.

7. The power generation apparatus of claim 6, wherein the tunnel includes a first tunnel through which the first wiring and the third wiring pass and a second tunnel through which the second wiring and the fourth wiring pass.

8. The power generation apparatus of claim 3, wherein
a fluid passing through the cooling unit is a first fluid, and
a second fluid having a temperature higher than that of the first fluid passes through the first heat sink and the second heat sink.

9. The power generation apparatus of claim 8, wherein the second fluid passes in a direction from the third surface toward the fifth surface.

10. The power generation apparatus of claim 9, wherein the tunnel includes a first tunnel extending from the first inlet in a direction facing the third surface and a second tunnel extending in a direction from the second inlet toward the third surface.

11. The power generation apparatus of claim 10, wherein the tunnel includes a third tunnel in which the first tunnel and the second tunnel are joined to extend in a direction toward the fourth surface and connected to the wire drawn-out part.

12. The power generation apparatus of claim 9, wherein the first inlet and the second inlet are formed in a first groove and a second groove of the fifth surface.

13. The power generation apparatus of claim 9, comprising a branch part disposed on the third surface, and branching the second fluid.

14. The power generation apparatus of claim 13, comprising a first guide plate spaced apart from the first thermoelectric module and a second guide plate spaced apart from the second thermoelectric module,
wherein the second fluid branched by the branch part passes between the first thermoelectric module and the first guide plate and between the second thermoelectric module and the second guide plate.

15. A power generation system comprising: a first power generation apparatus and a second power generation apparatus disposed apart from the first power generation apparatus,
wherein each of the first power generation apparatus and the second power generation apparatus includes:
a cooling unit including a first surface, a second surface facing the first surface, a third surface between the first surface and the second surface, a fourth surface perpendicular to the third surface between the first surface and the second surface, a fifth surface facing the third surface, and a sixth surface facing the fourth surface;
a first thermoelectric module including a first thermoelectric element disposed on the first surface of the cooling unit and a first heat sink disposed on the first thermoelectric element;
a second thermoelectric module including a second thermoelectric element disposed on the second surface of the cooling unit and a second heat sink disposed on the second thermoelectric element;
a first wiring part connected to the first thermoelectric module;
a fluid inlet, a fluid outlet, and a wiring drawn-out part disposed to be spaced apart from one another on the fourth surface of the cooling unit;
a fluid receiving part disposed in a first area of the cooling unit; and
a tunnel disposed in a second area of the cooling unit,
wherein the tunnel is connected to the wiring drawn-out part by passing in a direction from the fifth surface toward the fourth surface between the first surface and the second surface of the cooling unit,
wherein the tunnel includes a first inlet and a second inlet disposed to be spaced apart from each other on the fifth surface, and
wherein the first wiring part passes through the tunnel through at least one of the first inlet and the second inlet.

16. A power generation system of claim 15, wherein a distance between the fluid inlet and the fluid outlet is equal to a distance between the fluid inlet or the fluid outlet and the wiring drawn-out part in each of the first power generation apparatus and the second power generation apparatus.

17. A power generation system of claim 16, wherein the distance between the fluid inlet or the fluid outlet and the wiring drawn-out part of the first power generation apparatus is equal to a distance between the wiring drawn-out part of the first power generation apparatus and the fluid inlet or the fluid outlet of the second power generation apparatus.

* * * * *